(12) United States Patent
La Grou

(10) Patent No.: US 9,871,530 B1
(45) Date of Patent: Jan. 16, 2018

(54) MULTI-PATH ANALOG-TO-DIGITAL AND DIGITAL-TO-ANALOG CONVERSION OF PDM SIGNALS

(71) Applicant: John Howard La Grou, Placerville, CA (US)

(72) Inventor: John Howard La Grou, Placerville, CA (US)

( * ) Notice: Subject to any disclaimer, the term of this patent is extended or adjusted under 35 U.S.C. 154(b) by 0 days.

(21) Appl. No.: 15/598,802

(22) Filed: May 18, 2017

Related U.S. Application Data

(60) Provisional application No. 62/432,635, filed on Dec. 11, 2016.

(51) Int. Cl.
H03M 1/66 (2006.01)
H03M 7/30 (2006.01)
H03M 1/12 (2006.01)

(52) U.S. Cl.
CPC .......... *H03M 1/66* (2013.01); *H03M 1/12* (2013.01); *H03M 7/30* (2013.01)

(58) Field of Classification Search
CPC ............ H03M 1/66; H03M 1/12; H03M 7/30
USPC ............................................. 341/144
See application file for complete search history.

(56) References Cited

U.S. PATENT DOCUMENTS

| | | |
|---|---|---|
| 2,927,962 A | 3/1960 | Cutler |
| 3,345,578 A | 10/1967 | Shuda |
| 3,436,676 A | 4/1969 | Cook |
| 3,449,685 A | 6/1969 | Holmes |
| 3,845,416 A | 10/1974 | Dolby |
| 4,410,879 A | 10/1983 | Gumm |
| 4,450,433 A | 5/1984 | Moriyama |
| 4,843,392 A | 6/1989 | Gulczynski |
| 4,868,571 A | 9/1989 | Nami |
| 4,947,172 A | 8/1990 | Suzuki |
| 5,148,163 A | 9/1992 | Frindle |
| 5,323,159 A | 6/1994 | Imamura et al. |
| 6,163,288 A | 12/2000 | Yoshizawa |

(Continued)

FOREIGN PATENT DOCUMENTS

| | | |
|---|---|---|
| CN | 201550079 U | 8/2010 |
| EP | 0346605 A2 | 12/1989 |

(Continued)

OTHER PUBLICATIONS

Thomas Kite, Understanding PDM Digital Audio, Jan. 2012, Audio Precision, Inc., Beaverton, Oregon, US.

(Continued)

*Primary Examiner* — Brian Young
(74) *Attorney, Agent, or Firm* — Stone Creek Services LLC; Alan M Flum

(57) ABSTRACT

An analog-to-digital and digital-to-analog conversion system using pulse-density-modulation (PDM) digital signals which minimize noise and optimize dynamic range by dividing a signal into multiple parallel pathways by apportioning a least significant range portion of an incoming signal to a low-path circuit and a most-significant portion of the incoming signal to a high-path circuit. The high-path circuit and low-path circuit can be separately level-modified to optimize dynamic range. Embodiments of the system can include an analog-to-digital conversion, a digital-to-analog conversion, or a complete analog-to-digital and digital-to-analog conversion system.

28 Claims, 16 Drawing Sheets

(56) References Cited

U.S. PATENT DOCUMENTS

| | | | |
|---|---|---|---|
| 6,201,490 B1 | 3/2001 | Kawano et al. | |
| 6,204,790 B1 | 3/2001 | Jin et al. | |
| 6,317,457 B1 * | 11/2001 | Naruse | H03K 7/06 |
| | | | 332/112 |
| 6,359,514 B1 | 3/2002 | King et al. | |
| 6,362,764 B1 | 3/2002 | Niimi et al. | |
| 6,472,935 B2 | 10/2002 | King et al. | |
| 6,473,013 B1 | 10/2002 | Velazquez et al. | |
| 6,489,909 B2 | 12/2002 | Nakao et al. | |
| 6,593,868 B2 | 7/2003 | Clara et al. | |
| 6,639,463 B1 | 10/2003 | Ghanadan et al. | |
| 6,697,004 B1 | 2/2004 | Galton et al. | |
| 6,744,312 B2 | 6/2004 | White et al. | |
| 6,784,829 B1 * | 8/2004 | Jung | G01S 19/23 |
| | | | 342/357.62 |
| 6,822,595 B1 | 11/2004 | Robinson | |
| 6,853,244 B2 | 2/2005 | Robinson et al. | |
| 6,897,794 B2 | 5/2005 | Kuyel et al. | |
| 7,170,341 B2 | 1/2007 | Conrad et al. | |
| 7,183,959 B1 | 2/2007 | Dickey et al. | |
| 7,375,669 B2 | 5/2008 | Kim et al. | |
| 7,414,558 B2 | 8/2008 | Rivoir et al. | |
| 7,579,971 B2 | 8/2009 | Washburn et al. | |
| 7,826,578 B1 | 11/2010 | Melanson et al. | |
| 8,681,853 B2 * | 3/2014 | Dooper | H03M 3/376 |
| | | | 375/217 |
| 8,995,521 B2 * | 3/2015 | Laturell | H03F 3/24 |
| | | | 375/239 |
| 9,350,463 B2 | 5/2016 | Chiu | |
| 9,397,678 B2 | 7/2016 | Zhu | |
| 9,402,128 B2 | 7/2016 | Waller, Jr. | |
| 9,431,966 B2 | 8/2016 | Wang et al. | |
| 9,590,648 B2 | 3/2017 | La Grou | |
| 2002/0050937 A1 | 5/2002 | Boehm et al. | |
| 2003/0038674 A1 | 2/2003 | Masuda et al. | |
| 2003/0063022 A1 | 4/2003 | Eriksson et al. | |
| 2003/0083031 A1 | 5/2003 | Eriksson et al. | |
| 2004/0213356 A1 | 10/2004 | Burke | |
| 2013/0234871 A1 | 9/2013 | Eliezer et al. | |
| 2013/0234873 A1 | 9/2013 | Wyville | |
| 2014/0240154 A1 | 8/2014 | Kim et al. | |
| 2015/0035596 A1 | 2/2015 | Nussbaum et al. | |
| 2015/0048959 A1 | 2/2015 | Zhu | |
| 2016/0142069 A1 | 5/2016 | La Grou | |
| 2016/0344401 A1 | 11/2016 | La Grou | |

FOREIGN PATENT DOCUMENTS

| | | |
|---|---|---|
| EP | 0790709 A1 | 8/1997 |
| WO | 2016118674 A1 | 7/2016 |

OTHER PUBLICATIONS

Sangil Park, Principles of Sigma-Delta Modulation for Analog-to-Digital Converters: DSP—Digital Signal Processor Operation, APR 8/D, Jan. 1990, Motorola, Inc. Chicago, Illinois, US.

Super Audio CD: A Technical Overview, Sep. 2001, Sony Corporation & Royal Philips Electronics, New York, New York, US.

AK4490EN Premium 32-Bit 2ch DAC, Datasheet, Dec. 2015, Asahi Kasei, Tokyo, Japan.

AK5572 2-Channel Differential 32-bit Sigma Delta ADC, Datasheet, Dec. 2015, Asahi Kasei, Tokyo, Japan.

ADAU1772 Four ADC, Two DAC Low Power Codec with Audio Processor, Mar. 2014, Analog Devices, Inc. Norwood, Massachusetts, US.

ADAU7002 Stereo PDM-to-125 or TDM Conversion IC, Oct. 2016, Analog Devices, Inc. Norwood, Massachusetts, US.

Digital Mini High SNR SiSonic Microphone Specification, Feb. 16, 2012, Knowles Acoustics, Itasca, Illinois, US.

How to convert from PDM to PCM?, Discussion Forum Thread, Sep. 1, 2015, Downloaded from the Internet from: www.dsprelated.com /showthread/comp.dsp/288391-1.php on May 16, 2017.

PDM—Pulse Density Modulation Interface, Nordic Semiconductor, Oslo, Norway, downloaded from the Internet from: http://infocenter.nordicsemi.com/index.jsp?topic=%2Fcom.nordic.infocenter.nrf52832.ps.v1.1%2Fpdm.html, on May 4, 2017.

* cited by examiner

MULTI-PATH ANALOG-TO-DIGITAL AND DIGITAL-TO-ANALOG CONVERSION OF PDM SIGNALS

CROSS REFERENCE TO RELATED APPLICATIONS

This application claims the benefit of U.S. Provisional Patent Application No. 62/432,635, filed on Dec. 11, 2016. Differences between U.S. Provisional Patent Application No. 62/432,635 and the present disclosure are superseded by the present disclosure.

BACKGROUND

This disclosure relates to electronic devices and more particularly, to pulse-density-modulated (PDM) analog-to-digital (A-D) and digital-to-analog (D-A) conversion systems.

A-D conversion and D-A conversion can be used for subsonic, sonic, and ultrasonic frequency conversion and across diverse applications such as audio, video, seismology, vibrational analysis, materials science, acoustic microscopy, biomedicine, phased arrays, earth sciences, and many forms of test equipment.

A-D conversion is typically performed by a device known as an analog-to-digital converter (ADC). D-A conversion is typically performed by a device known as a digital-to-analog converter (DAC). Analog signals are commonly converted and represented digitally by a multi-bit conversion format called pulse-code modulation (PCM). Each PCM sample is represented by a discrete binary digital number, for example, 8, 16, 24, 32, or any other number of bits. PCM conversion is commonly realized using integrated circuits, and less commonly via discrete topologies, such as discrete R2R resistor ladder.

Analog signals are less commonly converted and represented digitally by a single-bit format generally known as PDM. In a PDM-represented analog signal, the relative density of the pulses corresponds to the analog signal amplitude. In a PDM bit-stream, a "1" (or "high") corresponds to a pulse of positive polarity and a "0" (or "low") corresponds to a pulse of negative polarity. A bit-stream consisting of all 1s would correspond to the maximum (positive) amplitude value, all 0s would correspond to the minimum (negative) amplitude value, and equally alternating 1s and 0s would correspond to a zero amplitude value. An example of a PDM digital-audio delivery format is sold by Sony Corporation under the registered trademarks, DIRECT STREAM DIGITAL® and DSD®.

In conventional PDM conversion topologies, a single dynamically-contiguous analog signal is converted by an ADC configured for PDM conversion, such as AK5572 by Asahi Kasei Microdevices, and represented in PDM data as a single, contiguous bit-stream. The PDM bit-stream can be reconverted into a single, dynamically-contiguous analog signal by a DAC configured for PDM operation, such as an AK4490 by Asahi Kasei Microdevices.

Two operational parameters of ADCs and DACs are self-noise and maximum level. The difference between self-noise and maximum level is called dynamic range. Historically, the dynamic range of audio-frequency ADCs and DACs has improved at roughly 0.7 decibels (dB) per year, on average, with three fundamental technical breakthroughs representing the majority improvement of historic dynamic range performance: electric recording and reproduction, magnetic tape recording and reproduction, and digital-audio recording and reproduction.

Improvements in ADC and DAC dynamic range can be found in both PCM and PDM conversion. However, the dynamic range performance of some aspects of PDM conversion have generally not kept pace with PCM conversion performance.

SUMMARY

The inventor recognized the limitations in dynamic range performance of the topologies discussed in the Background section and discovered systems and methods to improve the dynamic range performance in PCM conversion. This is the subject of the inventor's U.S. Pat. No. 9,590,648. The inventor also recognized similar dynamic range performance limitations of common PDM conversion topologies and discovered devices, systems, and methods to improve the dynamic range performance in PDM conversion. These devices, systems, and methods are described in this disclosure.

In comparison with conventional PDM A-D and D-A conversion, the inventor's multi-path PDM conversion of this disclosure improves maximum level and reduces broadband noise parameters of the PDM A-D and D-A conversion process. The multi-path PDM conversion of this disclosure, uses multiple parallel level-adapted A-D and D-A conversion pathways to achieve improved performance, a technique known variously as "adaptive," "ranging," "floating," "multi-range" or "multi-path," among others. The terms "multi-range" and "multi-path" and "adaptive" and others may be used interchangeably within the descriptions in this disclosure.

In creating a system and methods for a high dynamic range A-D and D-A conversion of PDM signals, the inventor realized that his previously-used technique of digital signal processor (DSP) mapping of PCM data could not be used on PDM signals. This is because PDM signals are "1-bit" per sample and traditional multi-bit PCM-based DSP processing cannot be directly used in the manner described in U.S. Pat. No. 9,590,648 to make the calculations and mappings required for PDM conversion management.

Through a series of discoveries, the inventor realized devices, methods and systems of high dynamic range, multi-path A-D and D-A conversion of PDM signals. At the A-D conversion side, a single-path, dynamically-contiguous, analog signal can feed parallel PDM ADC. In this multi-path A-D conversion topology, a low-range (high gain) analog input path may reach maximum signal level, or operational saturation, well before a high-range (low gain or attenuated) analog input path reaches saturation. A processor, such as digital signal processing, field programmable logic array (FPGA), programable logic device (PLD), application specific integrated circuit (ASIC), or digital signal management system, manages the A-D converted PDM signals into path memory storage. Alternatively, the PDM signals can be passed through in real-time (i.e., no memory storage) to a downstream multi-path environment.

In an embodiment, each adapted analog input signal path can be A-D converted to a unique PDM data stream, with each resulting PDM data stream representing a partial dynamic range of the original full-range analog signal. Each PDM data stream path, sourced from memory or in real-time, is then sent to a processor. Unlike PCM data streams, digitally combining native PDM data streams is not generally possible because PDM data is not generally conducive to conventional digital-mathematical processing techniques.

However, if the adapted (i.e., multiple) PDM A-D output data streams feeding DSP inputs could be combined in a manner analogous to multi-bit PCM adaptive techniques, the multi-path PDM data streams potentially represent a higher total dynamic range than could be achieved with a conventional, single-path PDM A-D conversion technique. As an example using a two-path PDM A-D conversion topology (low-path range and high-path range), the low-range PDM A-D converter path could represent a lower 80 dB level range (e.g., −130 dBu to −50 dBu) while the high-range PDM A-D converter path could represent a higher 80 dB level range (e.g., −50 dBu to +30 dBu). If the two native PDM digital signal streams could be effectively level-managed or otherwise intelligently cross-faded by the DSP environment, a resultant PDM signal stream with potentially 160 dB of dynamic range (low-range 80 dB+high-range 80 dB) could be achieved. But native PDM data cannot be mathematically combined in this manner while remaining in a 1-bit PDM format. The present disclosure will show a novel multi-path technique of appending or combining PDM data paths adaptively achieving higher dynamic range and lower noise than has been achieved with prior art single-path, PDM A-D and/or D-A conversion topologies.

In multi-bit PCM signals, dynamic range is represented by the total number of usable bits. For instance, sixteen usable bits has approximately 96 dB of usable dynamic range. In a PDM signal, dynamic range is represented by factors, predominantly the modulation frequency and oversampling and filter characteristics. It is impractical to achieve a PDM A-D conversion modulation rate much beyond 30 MHz. Similarly, oversampling filters much beyond 4th or 5th order may be impractical. The multi-path PDM conversion system and methods of this disclosure overcomes these PDM dynamic range limitations by several novel design techniques.

One embodiment is directed to an apparatus for adaptive PDM A-D conversion which achieves low noise and high dynamic level by using a two or more parallel PDM A-D conversion paths, each path optimized for a certain dynamic level range, and then using a digital management environment (i.e., a digital processing system or method with suitable speed and 1-bit processing characteristics) to create a PDM signal format suitable for synchronously storing the parallel adapted data streams into digital memory (for example, dynamic random access memory (DRAM), etc.). The two or more adapted parallel PDM signal streams can each be converted into a PCM multi-bit format, potentially allowing more efficient use of memory storage space, but requiring an additional PCM-to-PDM conversion step before D-A conversion. An embodiment of a PDM to multi-bit and a multi-bit to PDM conversion technique will provide for lossless conversion, but a lossy conversion technique can also be used, both of which can benefit from a reduced amount of memory or storage space required.

The multi-path PDM conversion device, system, and method is also directed to an apparatus for D-A conversion of a two or more adaptive paths of PDM data stored in memory (whether stored in a native PDM format or stored in a PDM to multi-bit PCM converted format, whether lossy or lossless), described above, to a single, dynamically-contiguous analog output signal of high dynamic range and low noise. It is now described in a summary manner how the two or more stored PDM signal streams (or PDM signal streams from converted multi-bit PCM signal streams) of the multi-path PDM conversion system are D-A converted back to an analog signal that retains high analog dynamic range and low analog broadband noise.

A memory holds two or more synchronous adapted PDM path data (or multi-bit PCM path data converted from PDM data), each data path representing partial dynamic range of the original analog input signal. The data from each PDM path stored in memory is then synchronously sent to a DSP environment which determines the optimal path to be D-A converted, and sends that data path to its associated PDM DAC, while preventing the other data path from being sent to its associated PDM DAC. If the data stored in memory is converted PDM data in multi-bit PCM format, as described, the multi-bit PCM data is reconverted (by the DSP environment or elsewhere) back to a PDM format before sending to a PDM D-A path conversion device. The DSP may employ an anticipatory function, which provides a predetermined delay to the multi-path output signals for some time period (Td) which provides the DSP with suitable time to perform the monitoring and synthesizing processes to prepare for, and execute, path-level transitions (i.e., the point of time, or range of time, when one data path must transition to the next data path, whether due to increasing level or decreasing level, to ultimately create a perceptively contiguous analog output signal.) During the time (Td) that the DSP delays the signal path data, the DSP calculates precise PDM pulse-form(s) required for transitional behavior and synthesizes the pulse-form(s) required during the transitional period, sending low-path and high-path synthesized pulse-form streams to the respective PDM D-A conversion devices (high and low) during the transitional time period, resulting ultimately in a perceptively linear and contiguous analog signal (i.e., no perceptible transition artifacts) at the final output, with one possible output being the analog summation of all systemic PDM DAC analog outputs. An alternate embodiment of this apparatus will process all described A-D, D-A, and DSP functions in real-time, using real-time (non-stored) data inputs, without need for data memory. An additional alternate embodiment of this apparatus includes a means to reduce or remove noise from the D-A paths of highest noise via a switch or other means. An additional alternate embodiment of this apparatus includes a means for the DSP to compensate the analog output level(s) based on temporary ADC level measurements of individual analog output paths.

The multi-path PDM conversion device, system, and method is also directed to an apparatus for A-D and D-A conversion of PDM signals using more than two parallel data or signal paths. Any two or more (n) of A-D or D-A adaptive process paths (2, 3, 4, 5, . . . n) can be realized. According to an embodiment, regardless of the two or more (n) of paths used and/or stored in the A-D and D-A conversion process, the DSP will manage the two or more paths to ultimately result in a single perceptively contiguous output signal of high dynamic range and low noise.

The apparatus further includes a two-path embodiment with a low-path gain modification devices which amplifies the low-path analog-to-digital input signal to produce an amplified low-path digital signal, and a high-path buffer which attenuates the high-path analog-to-digital input signal to produce an attenuated high-path signal. The apparatus further includes a two-path embodiment with a low-path attenuator which attenuates the low-path DAC output signal to produce an attenuated low-path analog signal, and a high-path gain modification device which can amplify the high-path DAC output signal to produce a high-path signal having a maximum level equal to the maximum output level of the apparatus. The apparatus further includes a passive summing node which, if a signal level characteristic of the input digital signal exceeds a threshold level, sums a low-path signal derived from the attenuated low-path analog signal and a high-path signal derived from the amplified high-path signal to produce the output analog signal and, if the signal level characteristic of the input digital signal does not exceed the threshold level, utilizes a means to reduce access of noise from the high-path gain modification device to the passive summing node. The apparatus further includes a means for level self-calibration using ADC feedback from the ultimate output(s) to the DSP. The DSP compares the actual output level(s) with expected level(s) and calibrates its output level adjustment(s).

This Summary introduces a selection of concepts in simplified form described the Description. The Summary is not intended to identify essential features or limit the Claims.

DRAWINGS

DESCRIPTION

This description references the figures, where like numerals refer to like elements throughout the several views. The novel multi-path PDM conversion systems can be applied to circuitry and components having a wide variety of operational parameters. For clarity, embodiments of the novel multi-path PDM system are illustrated as two-path systems in a multi-path A-D conversion system (100) of FIG. 1 and a multi-path D-A conversion system (300) of FIG. 3. Later in this description, these concepts will be extended to a multi-path A-D conversion system (400) in FIG. 4 and a multi-path D-A conversion system (500) in FIG. 5 with four paths.

Figure 1:
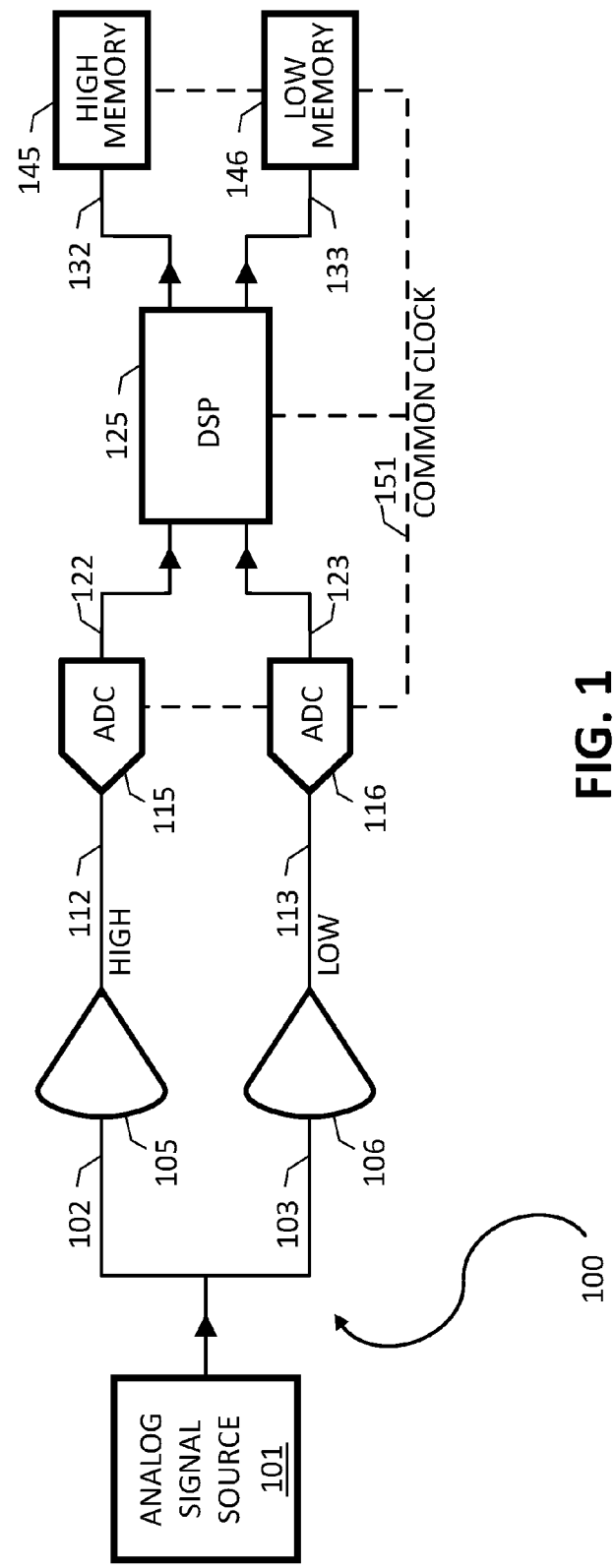
FIG. 1 shows a block diagram of an ADC, which separates the processing of a low-level range and a high-level range.

The multi-path A-D conversion system (100) of FIG. 1 shows an example of the adaptive A-D conversion process and system that a novel multi-path PDM conversion system can be built upon. The multi-path A-D conversion system (100) of FIG. 1 performs a multi-path A-D conversion of an analog signal source (101). The analog signal source (101) can be split into two identical paths: a high-path (102) and a low-path (103) and sent to high-path gain modification device (105) and low-path gain modification device (106), respectively. Throughout this disclosure, a gain modification device refers to any active or passive device capable of modifying the ratio of output to input signal level and can include amplifiers, attenuators, or buffering devices. Note that throughout this disclosure the term "gain" can refer to positive gain in dB or gain with a value of greater than one in ordinary numbers, or negative gain in dB or gain with a value between 0 to 1 in ordinary numbers. Negative gain in dB can be referred to as attenuation. Positive gain in dB can be referred to as amplification.

The multiple parallel pathways in multi-path adaptive A-D and D-A systems of FIGS. 1-5 can be thought of as a level range mapping system, where the original analog signal level can be split into multiple paths, with each path then being variously level-shifted to optimize each path for later decoding or remapping (e.g., inverse level adjustment) to achieve minimum noise and maximum level (i.e., maximum dynamic range). The maximum dynamic range result is realized both after summation into a single, contiguous analog output signal, or as discrete multi-path final output signals.

For the sake of clarity, in the description of FIG. 1 that follows specific noise values, signal levels, and gain/attenuation values are given, as an example, to aid the reader in understanding. These are not meant in any way to limit the multi-path A-D conversion system. Other noise values, signal levels, and gain/attenuation values can be readily substituted and still remain within the spirit of the multi-path adaptive conversion system of this disclosure. For the sake of example for our discussion of FIG. 1, we assume that low-path gain modification device (106) exhibits a broadband (i.e. 20 Hz-20 kHz audio bandwidth measurement), unweighted noise floor of −70 dBu at +60 dB of gain. We further assume that high-path gain modification device (105) exhibits a broadband, unweighted noise floor of −106 dBu at −20 dB gain (cut). These gain and noise assumptions of high-path gain modification device (105) and low-path gain modification device (106) will be referenced later.

In FIG. 1, low-path gain modification device (106) is configured as an amplifier (for example, an operational amplifier (op-amp) circuit, a transistor, or a hybrid gain circuit) with sufficient gain (for example, +60 dB) so an original analog signal (bracket "J" of FIG. 3C) has a usable (noise-free) minimum level of −130 dBu, can be extracted or decoded downstream, in part, with 80 dB of usable dynamic range above −130 dBu. High-path gain modification device (105) can be gain-configured for attenuation (for example, −20 dB) so an original analog signal having a maximum level of +30 dBu can be extracted or decoded downstream, in part, with at least 80 dB of usable dynamic range below +30 dBu. In the two-path embodiment, we assign a gain of +60 dB to low-path gain modification device (106) and we assign a negative gain of −20 dB (i.e., attenuation factor) to high-path gain modification device (105). In this example, the high-path gain modification device can be an attenuator, an amplifier or buffer that is attenuated (for example, an op-amp with attenuation). In an alternate embodiment, high-path gain modification device (105) could instead be a passive attenuator or transformer or other level reducing element configured with a −20 dB level cut.

Figure 4:
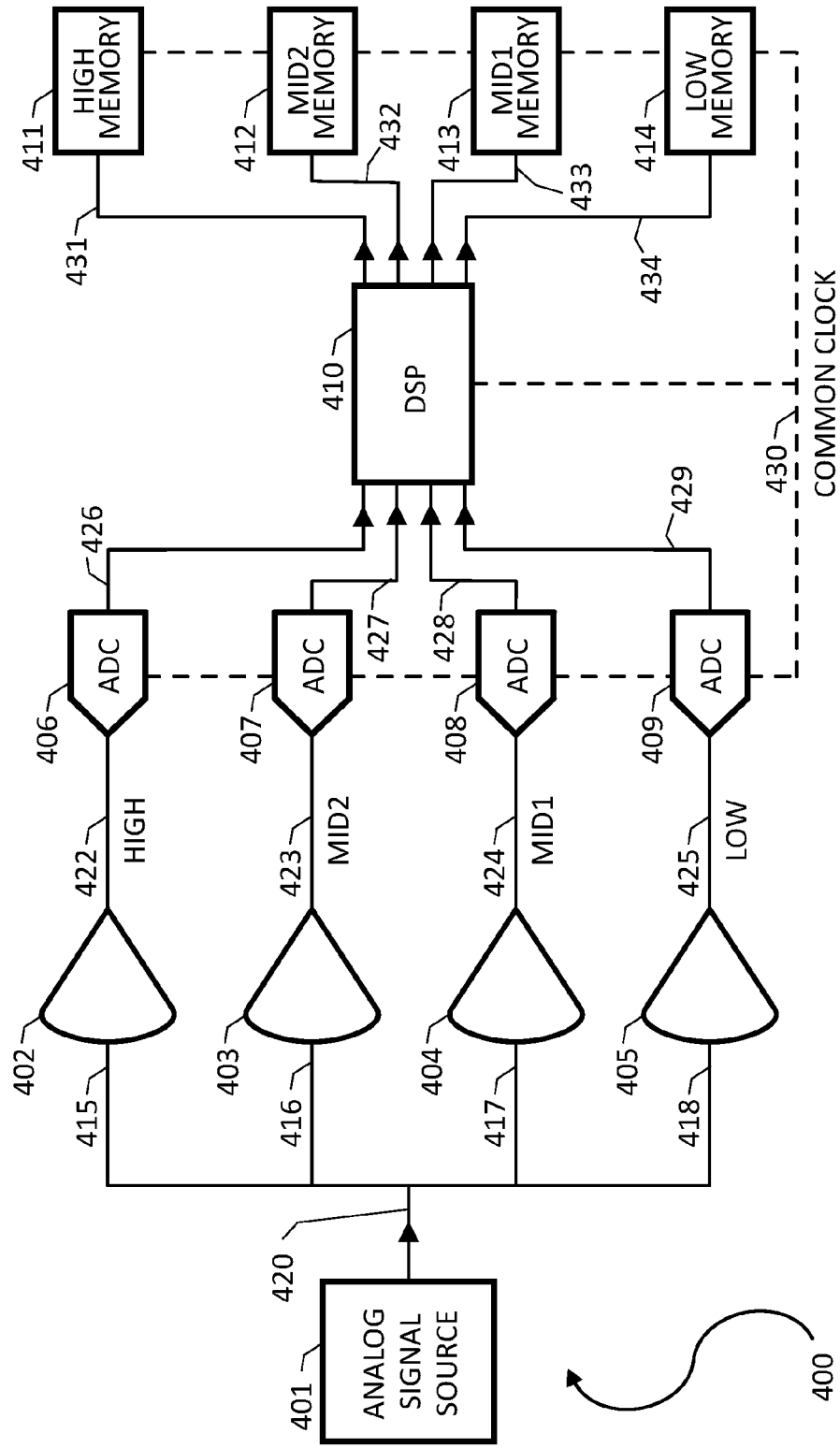
FIG. 4 shows a block diagram of a 4-path ADC.
Figure 5:
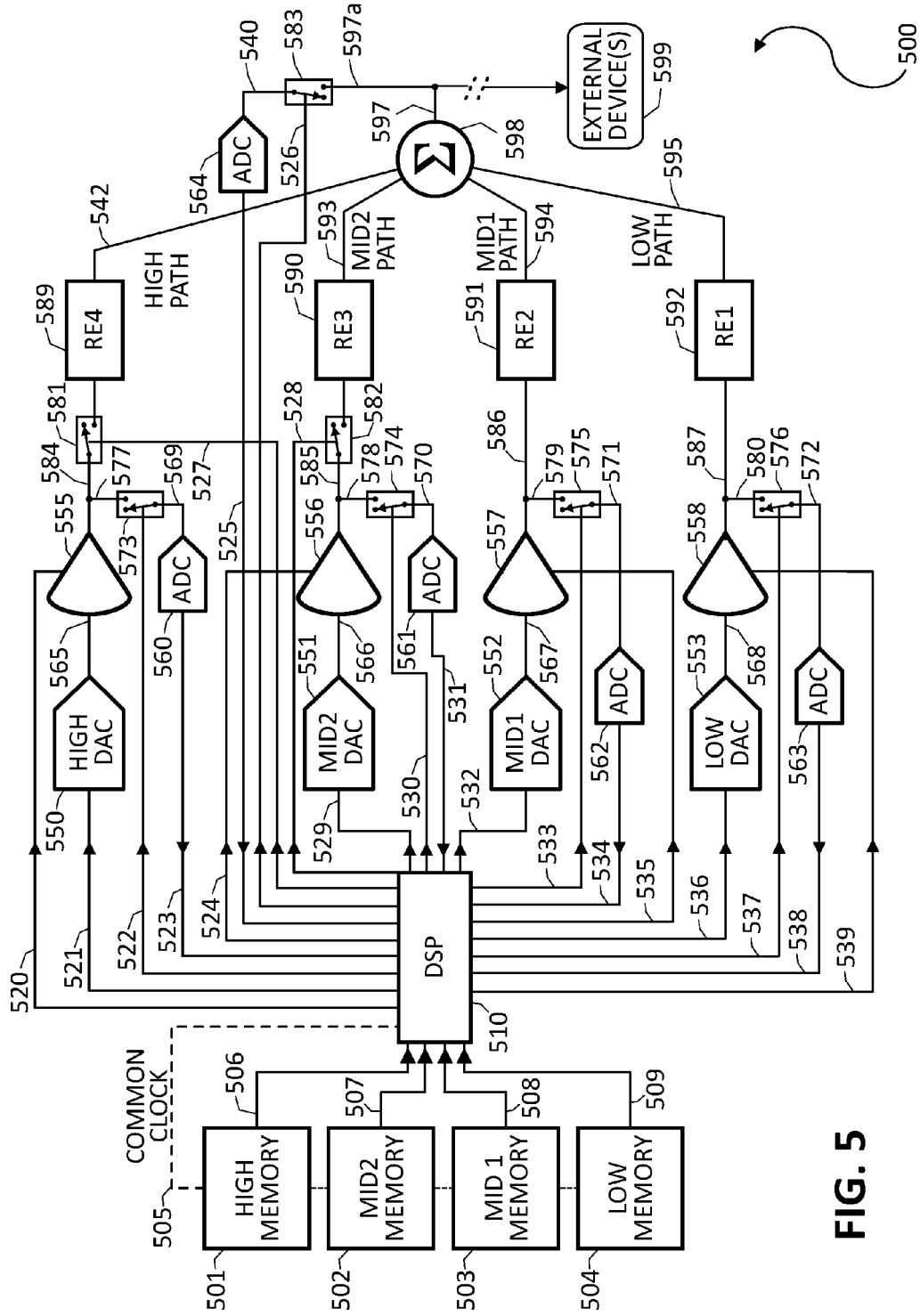
FIG. 5 shows a block diagram of a 4-path DAC.

The high-path gain modification device (105) and low-path gain modification device (106) feed the high-path gain modification device output path (112) and low-path gain modification device output path (113) respectively, to high-path PDM ADC (115) and low-path PDM ADC (116), respectively. Examples of PDM ADCs or ADCs capable of PDM conversion include AKM AK5552, Texas Instruments PCM4202, and others. The high-path PDM ADC (115) and low-path PDM ADC (116) are ADCs capable of producing a PDM output stream but do not necessarily exclusively produce a PDM output. For example, some ADCs can produce both PDM and PCM output streams. The high-path PDM ADC output path (122) and low-path PDM ADC output path (123) feed PDM data to a processor (125) capable of processing PDM for downstream storage or other downstream functionality. This processor (125) in FIG. 1, processor (302) in FIGS. 3, 3A, 3B, 3E-3K, processor (410) in FIG. 4, and processor (510) in FIG. 5 are all illustrated as DSPs. However, the processor can be any processor capable of performing the tasks described for the multi-path PDM conversion systems of this disclosure. These can include, DSPs, FPGAs, PLDs, ASICs, microprocessors, or digital processing environments with sufficient speed and power to perform the tasks described. Note that many off the shelf DSPs are not capable of performing the PDM conversion and processing described and therefore a specialized DSP, FPGA, PLD, ASIC, discrete logic, or other specialized processor may be required. In addition, some of the internal workings of the processor, such as in FIGS. 3A, 3F-3I, and 3K are illustrated as blocks. Some of these blocks may be hardware elements, software routines, or a mixture of hardware elements or software routines. The software routines that the processor executes to perform these functions can be stored and retrieved for execution from either memory internal to the processor or in external memory.

The high-path PDM ADC output path (122) and the low-path PDM ADC output path (123) are routed to separate inputs of the processor (125). Processor (125) converts the PDM data streams of the high-path PDM ADC output path (122) and low-path PDM ADC output path (123) into a high-path PDM stream (132) and low-path PDM stream (133), respectively, suitable for storage into memory locations (145), (146). These memory locations are equivalent to the memory locations (340), (341), respectively in FIG. 3. These memory locations (145), (146), (340), (341), can be internal or external to the processor (125), (302) and may or may not share the same physical memory devices as the program execution memory discussed in the previous paragraph. Alternatively, the processor (125) can stream the high-path PDM stream (132) and the low-path PDM stream (133) of FIG. 1 in real-time, without memory storage, directly to the D-A section via the high-path PDM stream (381) and the low-path PDM stream (382), respectively, of FIG. 3.

Figure 2:
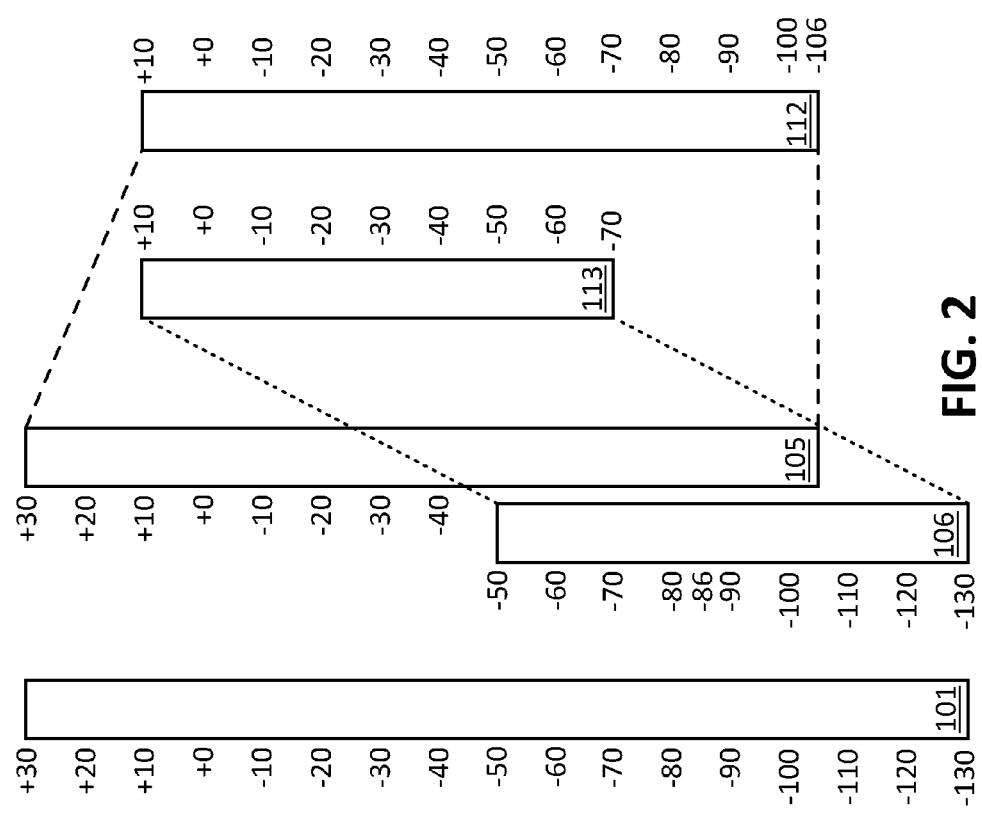
FIG. 2 shows adaptive analog level mapping of the low-level range and the high-level range before the analog-to-digital conversion process.

FIG. 2 shows the adaptive A-D conversion data paths of FIG. 1 as vertical level bars, with the top-most vertical span representing +30 dBu of analog level, and the bottom-most vertical span representing −130 dBu of analog level. In a generalized diagram, level bar could be in pure ratio in dB, rather than absolute levels in dBu. From FIG. 2, it will be clear that the analog signal source (101) of the embodiment intended for A-D and D-A conversions is given by example as spanning a noise-free dynamic range of 160 dB, which is shown as a level range of −130 dBu at the lowest level to +30 dBu at the highest level. The analog signal source (101) is then sent via two identical paths, low-path (103) and high-path (102) of FIG. 1. In FIG. 2, vertical bars representing the low-path gain modification device (106) and the low-path gain modification device output path (113) will condition and transfer 80 dB of usable dynamic range from the analog signal source (101) and the low-path (103) to low-path PDM ADC (116) of FIG. 1 via the low-path gain modification device output path (113). For the sake of this example, that low-path gain modification device (106) has +60 dB of level gain. At that gain, it is assumed for the sake of this example, that low-path gain modification device (106) exhibits −70 dBu of broadband noise. Hence, an analog signal with minimum usable program level −130 dBu and a maximum desired program level of −50 dBu, amplified by +60 dB by a low-path gain modification device (106) with −70 dBu of self-noise, will retain its minimum and maximum usable program information, but at a higher relative level the range of −130 dBu to −50 dBu will be mapped, or represented, by the range −70 dBu to +10 dBu.

As indicated by FIG. 2, vertical bars represent the high-path gain modification device (105) and the high-path gain modification device output path (112). Referring to both FIGS. 1 and 2, the high-path gain modification device (105) will transfer over 80 dB of usable dynamic range from the analog signal source (101) to high-path PDM ADC (115) (FIG. 1), via high-path gain modification device output path (112). However, since in this example, the high-path PDM ADC (115) has a maximum usable input level of +10 dBu, any analog signal source (101) greater than +10 dBu would be lost. To accommodate and retain a maximum +30 dBu signal level of analog signal source (101), in this example, the high-path gain modification device (105) can have −20 dB of attenuation. For the sake of example, we assume that the high-path gain modification device (105) with negative gain or attenuation will exhibit −106 dBu of broadband noise. In this scenario, an analog signal source (101) with minimum usable program level −106 dBu and a maximum program level of +30 dBu, reduced in level by −20 dB by a high-path gain modification device (105) with −106 dBu of self-noise, will retain 116 dB of usable program information, but at a lower relative level, namely +10 dBu to −106 dBu.

For the sake of this example, assuming that high-path PDM ADC (115) (FIG. 1) and low-path PDM ADC (116) each exhibit a broadband self-noise of −112 dBu, and each have a maximum input level of +10 dBu, the level-adapted low-path and high-path levels, as given by high-path gain modification device output path (112) and the low-path gain modification device output path (113), represent mapped, or coded, levels of the original signals that have been level-conditioned to fit within the low and high-level operating limitations of high-path PDM ADC (115) (FIG. 1) and low-path PDM ADC (116) (FIG. 1), respectively. Low-path and high-path data streams, as stored in memory locations (145), (146) (FIG. 1), are converted and appropriately level-shifted (decoded) by D-A-side processing (i.e., by the circuitry of FIG. 3 or other embodiments within the scope of this present disclosure.)

Referring to FIG. 1, the PDM "1-bit" high-path PDM stream (132) and low-path PDM stream (133) will be transferred into memory locations (145), (146) synchronous in time to a clock reference (151) common to PDM data conversion and transmission (i.e., adapted PDM data paths and storage can be synchronous to a common time base or clock.) The high-path PDM stream (132) and low-path PDM stream (133) can be stored in any memory format that retains the signal characteristics and shared timing (i.e., or otherwise correctable timing) of the original PDM data and clocking, and allows the characteristics and timing to be later retrieved in a lossless, path-synchronous manner. The physical digital storage method is not critical, and the storage can be any known method that allows for lossless storage and data retrieval at some future time (e.g., RAM, SD Card, SSD, Rotating Memory, etc.). Methods for digital storage of PDM data are well-established, though adaptive/multi-path A-D conversion and storage of PDM data is novel to the present multi-path PDM conversion system when coupled with methods and system for reconverting the multi-path PDM data back to an analog signal via novel adaptive PDM D-A techniques. After the high-path PDM stream (132) and low-path PDM stream (133) have been stored into memory locations (145), (146), respectively, a novel multi-path PDM D-A conversion process can be described. It should also be noted as a point of reference that, while methods for digital storage of synchronous unique PDM (PDM) data are well-established (e.g., stereo and multi-channel PDM program, etc.), a standardized technique of parallel storage for synchronous (i.e., sharing the same clock reference), parallel (multi-path), pre-adapted (level-mapped or level-coded) PDM data is unique to the present disclosure. Hence, a generalized method for the storage and interchange of pre-adapted, time-synchronous PDM data is suggested by the present disclosure.

Figure 3:
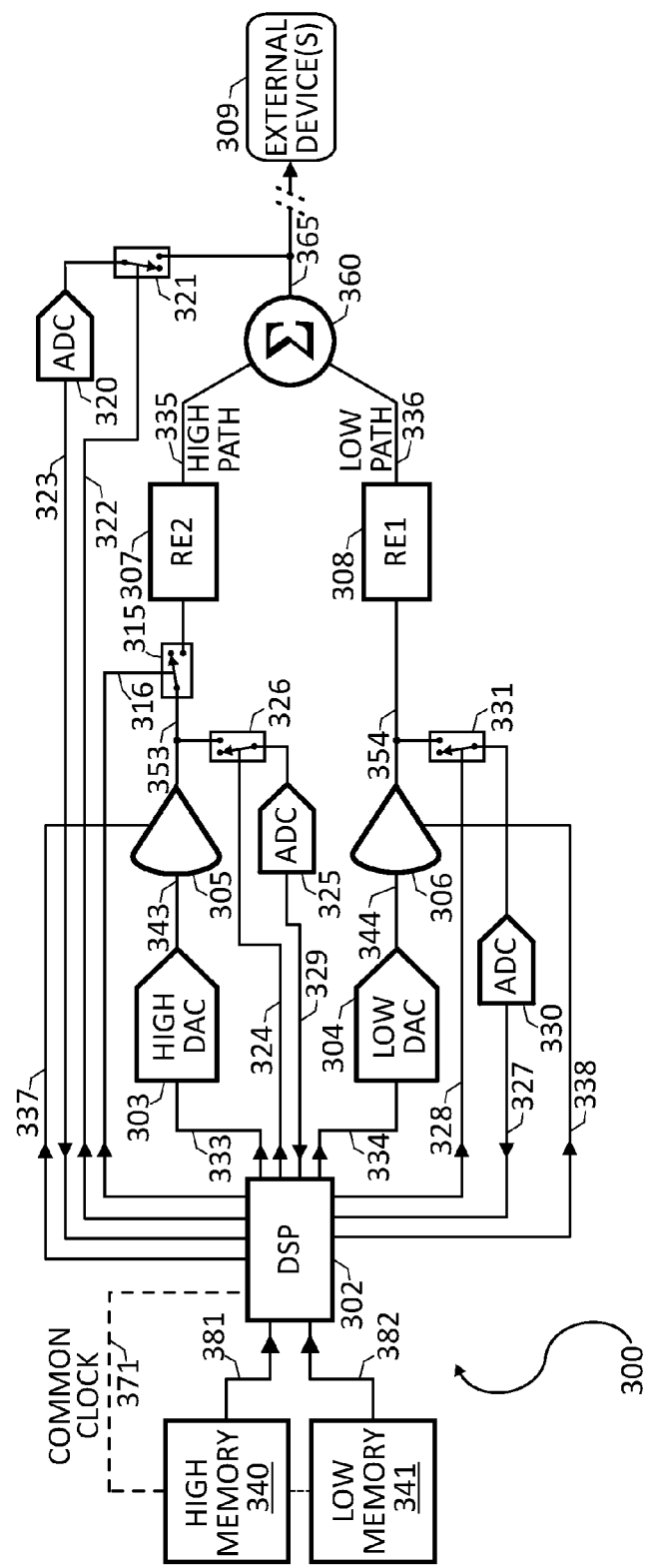
FIG. 3 shows a block diagram of a DAC which combines the processing of the low-range signal and high-range signal.

FIG. 3 is a graphical representation of an embodiment of a novel two-path PDM D-A conversion process path. The multi-path D-A conversion system (300) of FIG. 3 shows one example of the fundamental adaptive D-A conversion process and system which can be used by embodiments of the novel multi-path PDM conversion system. Stored synchronous, parallel, high-path PDM stream (132) and low-path PDM stream (133) as shown in FIG. 1 are shown stored in memory locations (340), (341) of FIG. 3, respectively, which are equivalent to memory locations (145), (146), respectively, shown on FIG. 1. A process of multi-path PDM D-A conversion begins with a synchronous transfer of data using clock signal (371) so the high-path PDM stream (381) and the low-path PDM stream (382) are sent synchronously to a processor (302) capable of receiving, routing, delaying, format-converting, switching and transmitting PDM data, among other functions described. The processor (302) must also be capable of multi-bit PCM processing, as is further described.

Figure 3A:
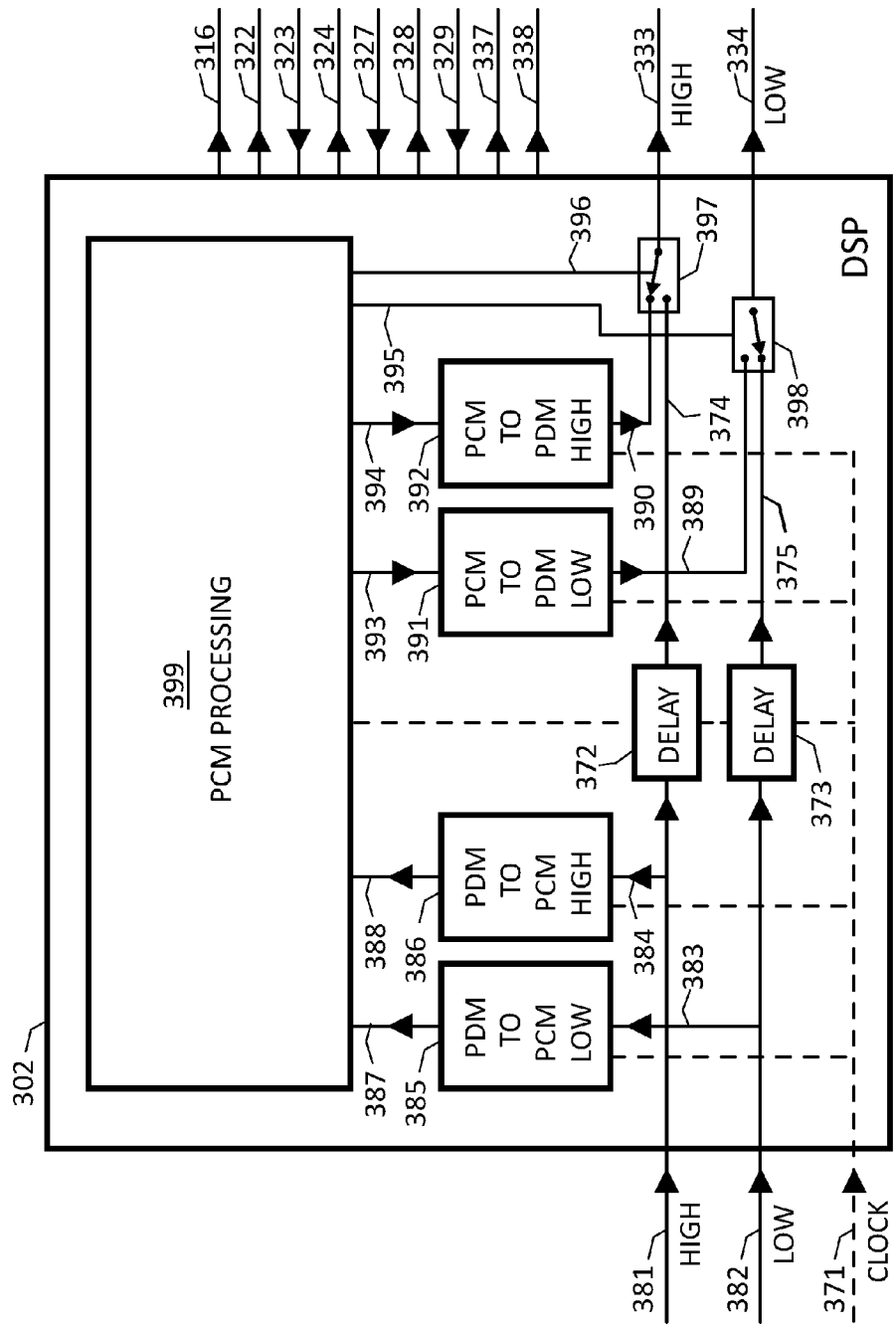
FIG. 3A shows the functional blocks and signal flow of a DSP.

Because 1-bit PDM data in its native format is not conducive to mathematical digital signal processing (i.e., the manner of mathematical digital signal processing associated with multi-bit PCM data), the processor (302) shown on FIGS. 3, 3A, 3E-3I, and 3K performs several functions which offer novel techniques of signal processing of adaptive PDM signals, as described in this disclosure. Referring to FIG. 3A, the processor (302) can be configured as both a continuous watchdog monitor and a transition period PDM signal synthesizer. The processor (302) can monitor the low-path PDM stream (382), side-chain PCM path (387), (388), the high-path PDM stream (381), for example. The processor can act as a transition period PDM signal synthesizer, via PCM processing (399), creating the synthesized high-path PDM transition stream (390) and the synthesized low-path PDM transition stream (389) that are selectively routable to the high-path PDM stream (333) and the low-path PDM stream (334), respectfully. Processor (302) performs both PDM-to-PCM conversion depicted by PDM-to-PCM conversion blocks (385), (386) and PCM-to-PDM conversion by PCM-to-PDM conversion blocks (391), (392). Processor (302) provides a time delay (372), (373) to the high-path PDM stream (381) and the low-path PDM stream (382). Processor (302) provides control signal paths (395), (396) and switching elements (398), (397) to switch the low-path PDM stream (334) and high-path PDM stream (333) between either or both of the delayed versions of the low-path PDM stream (382) and the high-path PDM stream (381) (i.e. low-path PDM stream (375) and high-path PDM stream (374)) and either or both of the synthesized low-path PDM transition stream (389) and synthesized high-path PDM transition stream (390), respectively.

Referring to FIG. 3, the processor (302) can measure analog output levels at the summed output (365), the high-path gain modification device output (353), and low-path gain modification device output (354) using the ADCs (320), (325), (330), respectively. Processor (302) also can calculate compensation values based on ADC (320), (325), (330) level readings at ADC outputs (323), (329), (327). Processor (302) can also control the control signal paths (322), (324), (328), switching elements (321), (326), (331) as shown on FIG. 3, and adjusting the gain of high-path gain modification device (305), low-path gain modification device (306) via control signal paths (337), (338). The processor (302) can eliminate or limit noise from high-path output (335) via control signal path (316) that controls the high-path switching element (315).

The adaptive multi-path A-D and D-A conversion systems described in this disclosure can process a full-range analog signal into separate paths based on level range. Each path typically exhibits a lesser dynamic range than the original signal. Based on optimization criteria, one or more of the separate signal paths is selected for use as an output signal. As the original full-range analog signal, adaptively represented in multiple paths, changes in level, optimization criteria may select different range path(s) for use as an intermediate or output signal. In FIG. 3 and FIG. 3A, the processor (302) and following circuitry provides a novel method of selecting and processing adapted multiple-path PDM data so it optimizes for low noise and high dynamic range.

Referring to FIG. 3, to perform a multi-path D-A conversion of the stored PDM data in memory locations (340), (341), the stored parallel path data is transferred synchronously (i.e, in the same time alignment as it was stored) via the high-path PDM stream (381) and the low-path PDM stream (382) into separate inputs of processor (302). Referring to FIG. 3A, the processor (302) routes the high-path PDM stream (381) and low-path PDM stream (382), respectively, to two locations, a direct-path and a side-chain PDM paths (384), (383), respectively, as shown in FIG. 3A. A first location where high-path PDM stream (381), low-path PDM stream (382) are routed through a time delay (372), (373). Each high-path PDM stream (381) and low-path PDM stream (382) is delayed by the identical time factor Td, for example, 20 milliseconds (ms), shown as bracket span Td in FIG. 3B. In an embodiment, the maximum delay time can be chosen to allow the PCM processing (399) to complete its processing routines, including transitional functions, which are further described. Referring again to FIG. 3A, high-path PDM stream (381) and low-path PDM stream (382) are also routed to a second location, a PDM-to-PCM conversion block (386), (385) via side-chain PDM paths (384), (383), respectively. Each high-path PDM stream (381) and low-path PDM stream (382) is converted by PDM-to-PCM conversion blocks (386), (385) into a side-chain PCM path (388), (387) that represents the original PDM signal stream (i.e., the PDM-to-PCM conversion techniques being well-understood to those skilled in the art.) The PDM-to-PCM conversion blocks (386), (385) performs the conversion so a precise representation of the original PDM signal stream can be mathematically processed via PCM processing block (399) of processor (302).

Continuing to refer to FIG. 3A, the PCM processing block (399) of processor (302) serves several functions, with certain PCM processing functions being applied to side-chain PCM path (387), (388) during the time (Td) in which low-path PDM stream (382) and high-path PDM stream (381) are being delayed by time delay (373), (372), as will be further described below. The fixed time delay (Td) of time delay (373), (372) is of a duration, for example, 15 ms, 20 ms, etc., that provides a suitable time window for the PCM processing block (399) to complete its transitional functions, as further described below. These time delays shown are representative examples. A wide range of delay periods and timing could be selected within the scope of embodiments of novel multi-path PDM conversion systems. One function of the PCM processing (399) is to monitor the equivalent audio level of each high-path PDM stream (381) and low-path PDM stream (382) on a continuous, uninterrupted basis (what was earlier called a "watchdog monitor" function). The equivalent output audio level of each high-path PDM stream (381) and low-path PDM stream (382), and the rate of level change over time of the levels, as measured by PCM processing block (399), are further described.

High-path PDM stream (381) and low-path PDM stream (382) are routed through processor (302) in a direct series-path that is time delayed via time delay (372), (373) and then switched via switching elements (397), (398) whose high-path PDM stream (333) and low-path PDM stream (334) are configured wiper common, respectively. High-path PDM stream (333) and low-path PDM stream (334) from the output of switching elements (397), (398) are the normative PDM output streams of processor (302) (i.e., in an embodiment, in the normative or "direct" states, either the high-path PDM stream (333) or the low-path PDM stream (334), but not both, will be active at any point in time.) As shown on FIG. 3, high-path PDM stream (333) and low-path PDM stream (334) from processor (302) are sent to a high-path PDM DAC (303) and a low-path PDM DAC (304), respectively. Referring to FIG. 3A, the processor (302) continuously monitors the high-range and the high-path PDM stream (381) and the low-path PDM stream (382), respectively, via side-chain PCM path (388), (387), respectively, and determines and selects high-path PDM stream (333) or low-path PDM stream (334) that is optimal for high-path PDM DAC (303) or the low-path PDM DAC (304), among other functions. The optimal output stream (i.e., the stream providing the optimal dynamic range and/or noise performance) is selected by processor (302) via control signal paths (395), (396) which control the state of gates or switching elements (397), (398). Referring to FIG. 3A by the wiper location of switching elements (397), (398), the low-path PDM stream (334) is shown connected to low-path PDM stream (375), which represents low-path PDM stream (382) after time delay (373), while high-path PDM stream (333) is shown disconnected from the high-path PDM stream (374). We assume that synthesized low-path PDM transition stream (389), and synthesized high-path PDM transition stream (390) are always "off" or in a PDM null or ground state when the processor (302) is in a "direct" state, further described.

In an embodiment, as shown in FIG. 3 and FIG. 3A, two operational states (direct and transitional), and three output switching (397), (398) configurations are possible. A first switching configuration, a "direct" state called "low-path direct," is as shown in FIG. 3A switching elements (397) has disengaged the high-path PDM stream (374) from high-path PDM stream (333), while switching element (398) has engaged the low-path PDM stream (375) with low-path PDM stream (334). A second switching configuration, a "direct" state called "high-path direct," is the opposite switching configuration of that shown in FIG. 3A, namely, switching element (397) has engaged the high-path PDM stream (374) to the high-path PDM stream (333), while switching element (398) has disengaged the low-path PDM stream (375) from low-path PDM stream (334). A third switching configuration is possible, what will be called a "transitional" state, in which both switching elements (397), (398) are oriented via control signal paths (396), (395) to connect synthesized low-path PDM transition stream (389), and synthesized high-path PDM transition stream (390) with high-path PDM stream (333) and low-path PDM stream (334), respectively. A detailed description of each switching configuration follows.

Referring to FIG. 3, in a first switching configuration, described as low-path-direct, high-path PDM DAC (303) receives zero or null data and exhibits zero signal output on the high-path DAC output (343), while low-path PDM DAC (304) receives an active PDM data stream and provides a corresponding low-path DAC output (344). The active low-path-direct data stream begins in memory locations (341) (or in real-time from low-path PDM stream (133) of FIG. 1), enters the processor (302) device via low-path PDM stream (382). In FIG. 3A, the low-path PDM stream (382) is continuously monitored by PCM processing block (399) via side-chain PDM path (383), PDM-to-PCM conversion block (385), side-chain PCM path (387), while the low-path PDM stream (382) is delayed by time delay (373) by a fixed duration of time Td, and is then sent from the time delay (373) via low-path PDM stream (375) to switching element (398) which is held in a state by PCM processing (399) via control signal path (395), that causes low-path PDM stream (375) to remain continuously active at low-path PDM stream (334) while high-path PDM stream (333) is held off (open) via switching elements (397) controlled by PCM processing (399) via control signal path (396).

Referring to FIG. 3, In a second switching configuration, described as high-path-direct, low-path PDM DAC (304) receives zero or null data and exhibits zero signal output on the low-path DAC output (344), while high-path PDM DAC (303) receives high-path PDM stream (333) and provides a corresponding analog output on the high-path DAC output (343). The active high-path data stream begins in memory locations (340) (or in real-time from high-path PDM stream (132) of FIG. 1). Referring to FIG. 3A, the high-path PDM stream (333) enters the processor (302) device via high-path PDM stream (381), is continuously monitored by PCM processing block (399) via side-chain PDM path (384), PDM-to-PCM conversion block (386), and side-chain PCM path (388), while the high-path PDM stream (381) is delayed by time delay (372) by a fixed duration of time Td, and is then sent from the time delay (372) via the high-path PDM stream (374) to switching elements (397) which is held in a state by PCM processing (399) via control signal path (396) that causes signal of the high-path PDM stream (374) to remain continuously active at the high-path PDM stream (333) while low-path PDM stream (334) is held off (open) via switching element (398) controlled by PCM processing (399) via control signal path (395).

A third switching configuration occurs during the "transitional" state. The transitional state occurs during periods of time when an input signal increasing in level reaches a representative level that requires an output transition from low-path PDM stream (334) to the high-path PDM stream (333), or an input signal decreasing in level that requires an output transition from high-path PDM stream (333) to low-path PDM stream (334). The transitional state occurs between the two direct switching configurations, described above (i.e., between the first described switching configuration and the second described switching configuration). Because it is impractical to achieve real-time, mathematical signal processing (e.g., multiple signal combining, signal level shifting or cross-fading, etc.) on native 1-bit PDM signals, a transitional switching state may be required to low-path PDM stream (334) and high-path PDM stream (333) during the period (Tt) required of the low-path to high-path or the high-path to low-path transition state. A detailed description of the transitional state follows.

One of the inventor's discoveries is that an adaptive multi-path A-D and D-A conversion using PDM signals can improve the dynamic range and noise floor performance over that realized with non-adaptive single-path PDM A-D and D-A conversion. In the inventor's previous multi-path PCM conversion system, he used multi-bit PCM techniques to achieve improved dynamic range and noise floor performance by combining multiple paths of partial dynamic range signals into a complete (non-partial) output signal. Partial-range, multi-bit PCM data allows direct mathematical signal processing toward these improved outcomes, whereas partial-range native PDM signals are not practical to process using conventional mathematical techniques. Because of this, PDM signals are difficult to combine in their native state. The inventor developed a novel approach for combining multi-path PDM signals.

Referring to FIG. 3 and FIG. 3A, we start with stored PDM data (referenced from FIG. 1) in memory locations (340), (341) (equivalent to FIG. 1, memory locations (145), (146)). The stored PDM data will represent a low-path PDM stream (382) and high-path PDM stream (381) of rising level (i.e., high-path PDM stream (381) and low-path PDM stream (382) represent the same signal but at different "adapted" levels.) A low-level PDM signal stored in memory locations (341) is sent synchronously via low-path PDM stream (382) to processor (302). Both low-path PDM stream (382) and high-path PDM stream (381) and their rate of level change (level change per time), are continuously monitored by PCM processing block (399) via side-chain PDM paths (383), (384), PDM-to-PCM conversion blocks (385), (386), side-chain PCM paths (387), (388). Side-chain PDM path (383), PDM-to-PCM conversion block (385), and side-chain PCM paths (387) is used for monitoring the low-path PDM stream (382) and side-chain PDM paths (384), PDM-to-PCM conversion block (386), and side-chain PCM path (388) is used for monitoring the high-path PDM stream (381). A PDM-to-PCM conversion block (385), (386) converts the side-chain PDM paths (383), (384), respectively, into a representative multi-bit PCM format suitable for processing by PCM processing block (399). The precise timing and waveform parameters of the original PDM data in side-chain PDM paths (383), (384) will be retained in a multi-bit PCM format, relative to clock signal (371), which will facilitate the conversion of side-chain PCM path (387), (388) back to the synthesized low-path PCM stream (393) and the synthesized high-path PCM stream (394) for use during a transitionary period, with no substantive loss of the high-path PDM stream (381) and low-path PDM stream (382) signal timing and/or digitally-represented waveform (i.e., analog signal source (101) of FIG. 1) parameters. The PCM processing block (399) is continually measuring the equivalent level and the rate of change of the level of side-chain PCM path (387), (388), which are the PCM representations of low-path PDM stream (382) and high-path PDM stream (381), respectively. When low-path PDM stream (382) remains at a sufficiently low-level, as determined by PCM processing block (399), the PCM processing block (399) sends control signal paths (395), (396) so it holds the switching elements (398) closed and holds the switching elements (397) open (i.e., the switching configuration as depicted in FIG. 3A, known as "low-path direct"), so low-path PDM stream (382) is ultimately sent to the low-path PDM stream (334) and the high-path PDM stream (333) is off or at a PDM null state that results in an off-state for high-path PDM DAC (303) output.

As low-path PDM stream (382) rises to a characteristic level that indicates a required output transition state from the low-path PDM stream (382) via the low-path PDM stream (334) to a high-path PDM stream (381) via the high-path PDM stream (333), the PCM processing block (399) sends control signals via control signal paths (395), (396) that place both switching elements (397), (398) in the state where switching elements (397), (398) wipers are connected to synthesized low-path PDM transition stream (389), and synthesized high-path PDM transition stream (390), respectively. At the instant in which PCM processing block (399) causes switching elements (397), (398) to be connected to synthesized low-path PDM transition stream (389), and synthesized high-path PDM transition stream (390), PCM processing block (399) sends a synthesized PCM signal via synthesized low-path PCM stream (393) which is converted by PCM-to-PDM conversion block (391) to a PDM signal stream and sent via synthesized low-path PDM transition stream (389) to low-path PDM stream (334) via switching element (398). The synthesized low-path PDM transition stream (389) replaces the low-path PDM stream (375) during the transitional period. Digital gates or switching elements (397), (398) are of sufficiently high speed and sufficiently low propagation delay to facilitate the required seamless replacement (i.e., a perceptively continuous, linear and glitch-free transition) of the signals on the low-path PDM stream (375) and the high-path PDM stream (374) with synthesized low-path PDM transition stream (389), and synthesized high-path PDM transition stream (390), respectively, with insignificant compromise to PDM signal linearity and/or edge timing continuity at the transition point. The inventor discovered that with a typical PDM sampling rate of 22.4 MHz, a propagation delay of 2 ns or less exhibited by switching elements (397), (398) (i.e., roughly 10× faster than the fastest PDM clock edge transition period, which is within the propagation delay parameters of conventional switching logic) is sufficiently fast enough to facilitate a continuous, glitch-free PDM direct-waveform to synthesized waveform substitution.

At the first instant at which the level of the low-path PDM stream (382) rises to a point which triggers PCM processing (399) to initiate a path transition state, and throughout the entire transition period (Tt of FIG. 3B), the synthesized low-path PDM transition stream (389) will begin with and remain as an effectively identical program signal to the low-path PDM stream (375) it has replaced, while being gradually level-reduced (faded out) during the transition period (via PCM processing block (399) processing), with the end of the present example transition period defined by or about the point in time at which synthesized low-path PDM transition stream (389) falls to zero or null level. Synthesized low-path PDM transition stream (389) remains as an effectively identical program signal to the low-path PDM stream (382) resulting from the low-path PDM stream (382) having been delayed by time delay (373) by a period sufficient for PCM processing (399) to monitor and precisely synthesize the low-path PDM stream (382) for the entire duration of time (Tt) of the transition state period. At the first instant at which level of the low-path PDM stream (382) rises to a point which triggers the beginning of a transition period, the synthesized high-path PDM transition stream (390) will be off or at a PDM null state. During the full duration (Tt) of the low-path PDM stream (334) to the transition period of the high-path PDM stream (333), PCM processing (399) will continuously reduce the level of the synthesized low-path PDM transition stream (389) in an inverse slope relative to synthesized high-path PDM transition stream (390), which PCM processing (399) will cause to continuously increase in level. The net level of the sum of synthesized low-path PDM transition stream (389), and synthesized high-path PDM transition stream (390) at summed output (365) of FIG. 3, at any point in time during the transitional period, will remain equivalent relative to an analog signal source (101) of FIG. 1.

Because of the inherently different waveform rise timing of different frequencies, a higher frequency program material will require a shorter delay period (Td), while a lower frequency program material will require a longer delay period (Td). A specific delay period is not required, though the time delay (Td) provided by time delay (372), (373) will be of a sufficient period of time to allow for PCM processing (399) and the synthesis of the synthesized low-path PCM stream (393) and the synthesized high-path PCM stream (394) as well as control of the switching elements (397), (398) at a desired lowest frequency boundary of original source material. For example, from the analog signal source (101), to allow for a perceptively linear and glitch-free transitional period at a desired lowest frequency of operation.

Figure 3B:
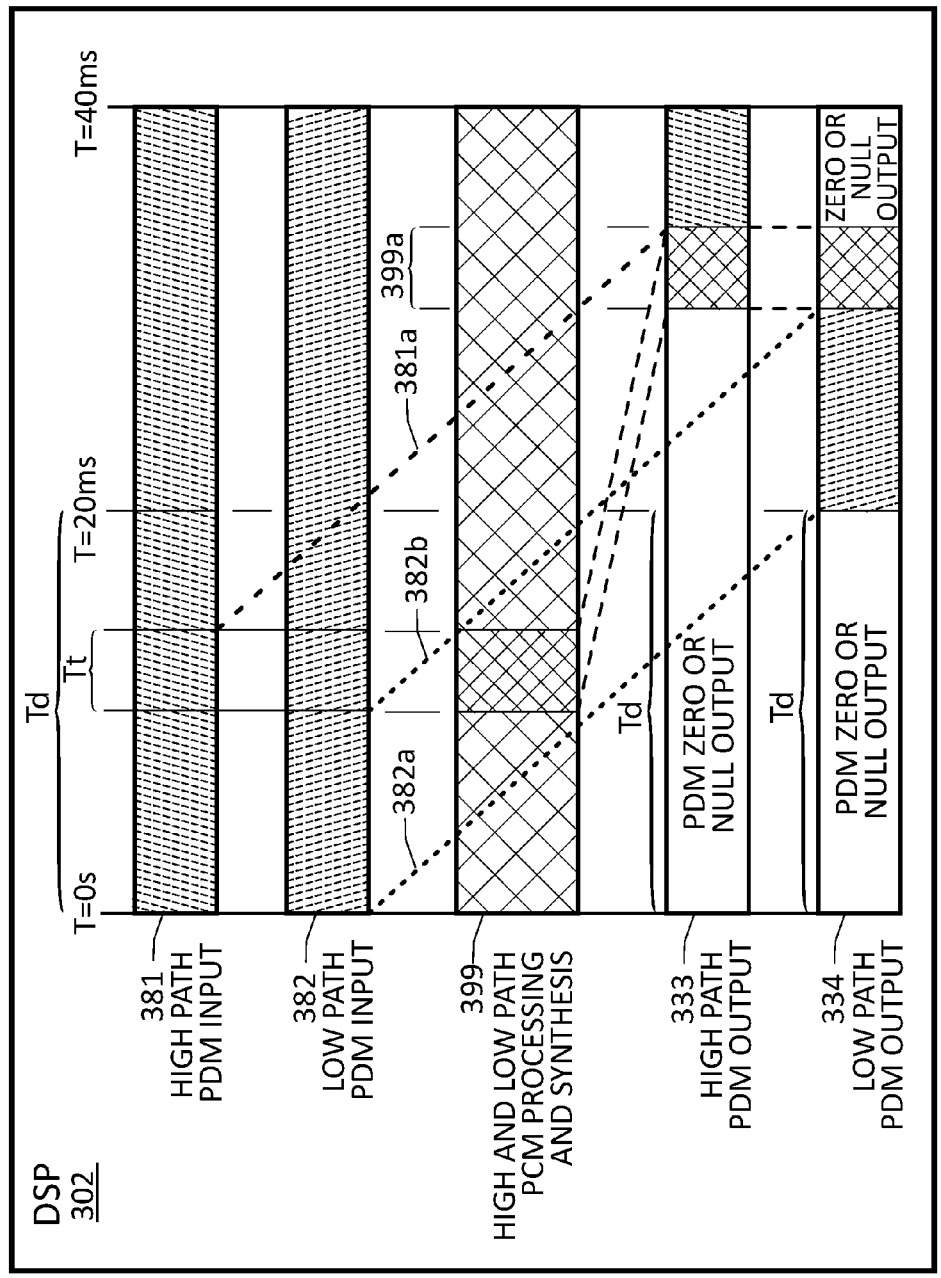
FIG. 3B shows the timing, delay, and transitional state characteristics of the DSP input and output signals in FIG. 3A.
Figure 3C:
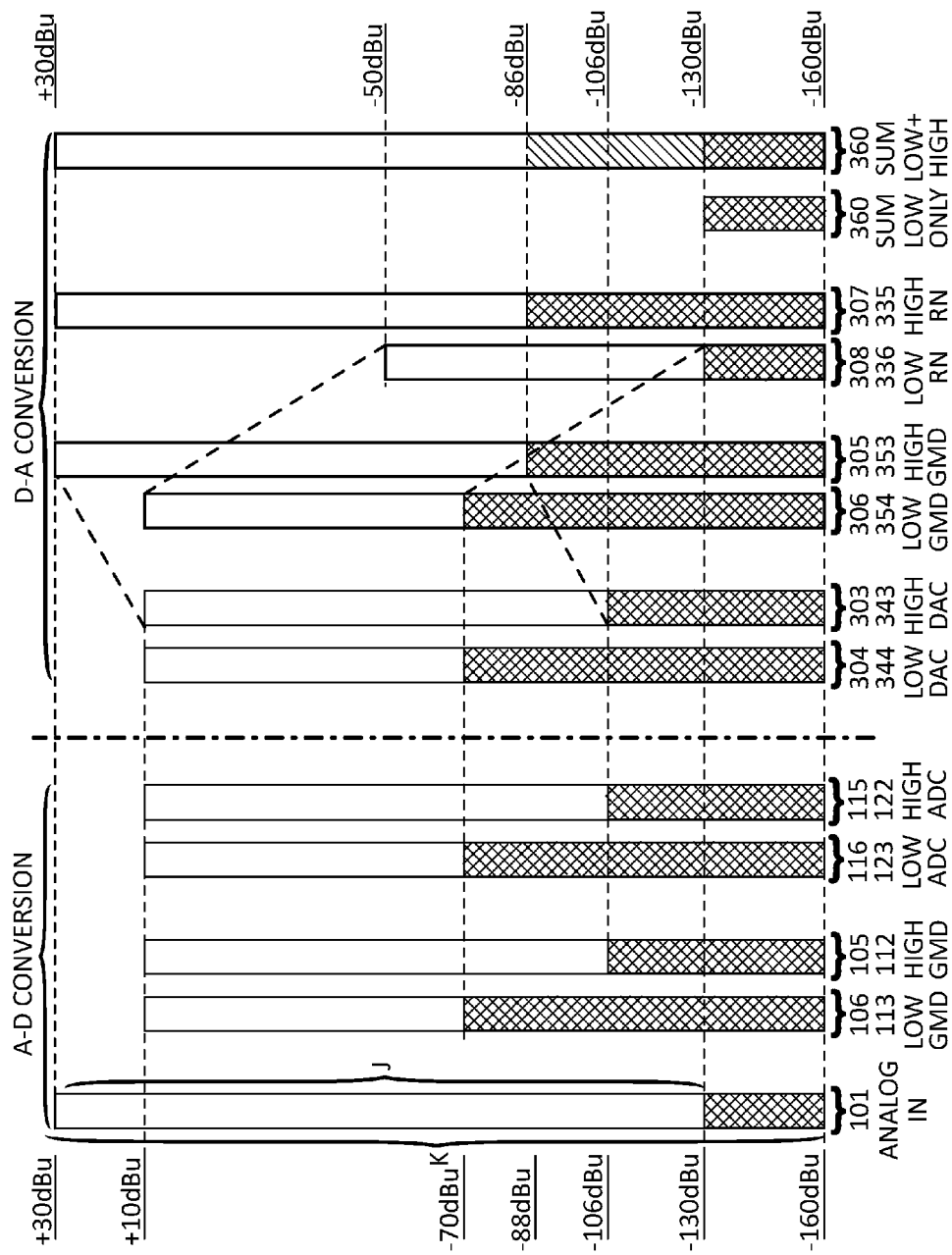
FIG. 3C shows signal and noise levels at various points in the circuit of FIGS. 1 and 3 where the entire analog range J is utilized.
Figure 3D:
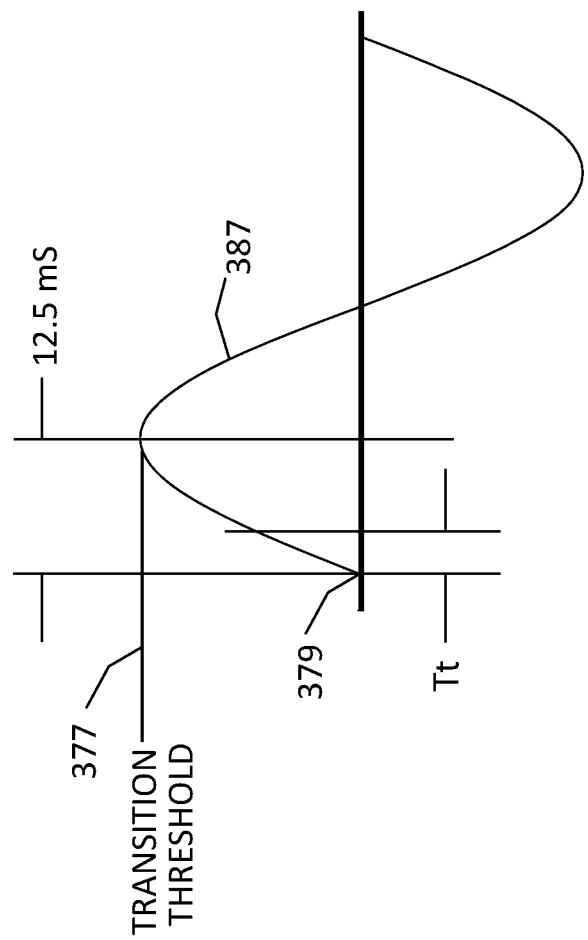
FIG. 3D shows amplitude and timing considerations of a representative low frequency input signal in a DSP.

As an example, FIG. 3D shows a typical lower audio-frequency bound of 20 Hz as a sine wave on the side-chain PCM path (387) input (via analog signal source (101) of FIG. 1, memory location (146) of FIG. 1, low-path PDM stream (382), etc.), with a maximum amplitude excursion that has just exceeded a transition threshold level (377). Referring to FIG. 3A, a PDM-encoded 20 Hz pure sine input source on the side-chain PCM path (387) of a peak level that rises to a transition threshold level (377) of FIG. 3D that is predetermined and will require approximately 12.5 ms of PCM processing block (399) monitoring time (via side-chain PDM path (383), side-chain PCM path (387), and PDM-to-PCM conversion block (385)) before the processing (399) can determine that the input signal being monitored has exceeded a threshold that will require a path transition event at or near zero-crossing. After PCM processing (399) determines that the side-chain PCM path (387) has exceeded a transition threshold level (377) of FIG. 3D, an additional amount of processing time will be required for the PCM processing (399) to carry out the steps required to initiate a complete path transition event, namely configuring the switching elements (397), (398), via control signal paths (395), (396), to connect with synthesized high-path PDM transition stream (390) and synthesized low-path PDM transition stream (389), respectively, while initializing the synthesized low-path PDM transition stream (389), and synthesized high-path PDM transition stream (390) to be used during the transition period. The low-path to high-path transition period is complete at the instant when synthesized high-path PDM transition stream (390) has risen to maximum level and the synthesized low-path PDM transition stream (389) has fallen to zero or null level. At this precise point in time (i.e., the completion of the low to high-path transition period), the PCM processing block (399) will configure (close, downward wiper condition) switching elements (397), via control signal paths (396), to stream direct high-path PDM data on the high-path PDM stream (374), high-path PDM stream (333) into high-path PDM DAC (303), and will configure (open, upward wiper condition) switching element (398), via control signal path (395), so that no low-path PDM streams (375), (334) are sent into low-path PDM DAC (304), assuring that low-path PDM DAC (304) now remains at zero output. After the low-path to high-path transition period ends, the switching elements (397), (398) are configured in the opposite manner to that shown in FIG. 3A, or "high-path direct." If a zero-crossing transition point is not required, Td (and/or Tt) can be of a shorter duration. This is because the delay and look-ahead nature of the DSP can identify a transition point requirement near-instantaneously followed immediately by a transitional event. With suitably fast DSP, and no zero-crossing transitional requirement, the delay period can be reduced to the low milliseconds or microseconds.

When a high-path PDM stream (381) falls to a lower characteristic level that indicates a required output transition state from high-path PDM stream (381) via the high-path PDM stream (333) to low-path PDM stream (382) via low-path PDM stream (334), the PCM processing block (399) sends control signal paths (395), (396) so it places both switching elements (397), (398) in the state where switching elements (397), (398) wipers are connected to synthesized low-path PDM transition stream (389), and synthesized high-path PDM transition stream (390), respectively. The high to low transitional state is simply a reverse process from earlier low-path to high-path transition example. The high-path to low-path transition period is complete when the synthesized low-path PDM transition stream (389) has risen to maximum level and the synthesized high-path PDM transition stream (390) has fallen to zero or null level. At this precise point in time (i.e., the completion of the high to low transition period), the PCM processing block (399) will configure (close, downward wiper condition) switching element (398), via control signal path (395), to low-path PDM stream (375), (334) into low-path PDM DAC (304) of FIG. 3, and will configure (open, upward wiper condition) switching elements (397), via control signal paths (396), so that zero or null high-path data of the high-path PDM stream (374), the high-path PDM stream (333) is input to high-path PDM DAC (303), assuring that high-path PDM DAC (303) of FIG. 3 now remains at zero output. After a high-path to low-path transition period ends, the switching elements (397), (398) are configured in the same manner to that shown in FIG. 3A, or "low-path direct."

Routine propagation delays and other conventional digital logic-based timing and delay effects are ignored to simplify the discussion within this disclosure. Handling such routine delays are well-understood to those skilled in the art.

FIG. 3B shows detailed timing information of the processor (302) operation. Each high-path PDM stream (381) and low-path PDM stream (382) can be delayed by the time delays (372), (373) of FIG. 3A by the identical time factor Td in a continuous first-in-first out (FIFO) manner. As an example, we assign Td=20 ms, as shown in FIG. 3B by the horizontal bracket (Td) starting at T=0 and ending at T=20 ms. The delay of the high-path PDM stream (381) and low-path PDM stream (382) is shown graphically by low-path PDM stream (334) starting 20 ms after the low-path PDM stream (382), which is also indicated by the bottom end of dashed line (382*a*). High-path PDM stream (381) and low-path PDM stream (382) are also routed to a second location, which is seen on FIG. 3A as PDM-to-PCM conversion block (386), (385) via side-chain PDM paths (384), (383), respectively. Each high-path PDM stream (381) and low-path PDM stream (382) is converted into a side-chain PCM path (388), (387) that is a faithfully representative (PCM-encoded) coding of the original PDM signal stream. The PDM-to-PCM conversion block (385), (386) is performed so it provides a precise PCM representation of the original PDM signal streams to mathematically process the represented PDM streams via PCM processing block (399) of processor (302).

Referring to FIGS. 3A and 3B, the fixed input signal time delay (Td) given by time delays (373), (372) is of a duration that provides a suitable time window for PCM processing (399) to complete its transitional functions, as described. PCM processing (399) continuously monitors the high-path PDM stream (381) and the low-path PDM stream (382), respectively, via side-chain PCM path (388), (387), respectively. PCM processing (399) determines which the high-path PDM stream (333) or the low-path PDM stream (334) is optimal for high-path PDM DAC (303) or low-path PDM DAC (304), among other functions. From FIG. 3B, we consider a high-path PDM stream (381) and low-path PDM stream (382) starting at T=0 rising rapidly to a higher-level. Because the starting signal level (at T=0) of the high-path PDM stream (381) and low-path PDM stream (382) is relatively low (i.e., below the threshold for a transition event to occur), PCM processing block will route, via switching elements (397), (398), the low-path PDM stream (382) as the low-path PDM stream (334). This is represented in FIG. 3B by the dashed line (382*a*) at T=0 extending diagonally 20 ms ahead so the low-path PDM stream (334) starting at T=20 ms is identical to low-path PDM stream (382) starting at T=0, but always delayed by 20 ms.

As represented in FIG. 3B, during the initial 20 ms period (Td), the PCM processing block (399) is actively performing several tasks, as represented by PCM processing block (399) filled with cross-hatching, the cross-hatching representing the concurrent PCM processing of side-chain PCM path (387), (388). In an embodiment, the specific tasks performed by PCM processing (399) are given as, real-time continuous level monitoring of high-path PDM stream (381) and low-path PDM stream (382) via representative PCM data on the side-chain PCM path (388), (387) that is converted via PDM-to-PCM conversion blocks (386), (385), determination of rising or falling program level and the rate of the side-chain PCM path (388), (387), maintain switching elements (397), (398) in either low-path-direct or high-path-direct configuration, dependent upon monitored input level on the side-chain PCM paths (388), (387) relative to a predetermined threshold level, determine the precise start-point and end-point of a transition event (Tt), based on monitored input signal level data on the side-chain PCM path (388), (387) relative to a predetermined threshold level, engage and maintain switching elements (397), (398) in a transition state configuration during a predetermined transition event, sample and hold the side-chain PCM path (388), (387) in a dual-port continuously running FIFO memory for a contiguous period (e.g., 20 ms) with an ability to simultaneously write, read and separately store any block of data, create and store a time-stamp marker for each represented analog zero-crossing of the side-chain PCM path (388), (387), synthesized low-path PCM stream (393), synthesized high-path PCM stream (394), synthesized low-path PDM transition stream (389), synthesized high-path PDM transition stream (390) for use during a transition event period, and, determine linear and perceptively glitch-free timing for the entry and exit of the synthesized low-path PCM stream (393), synthesized high-path PCM stream (394), synthesized low-path PDM transition stream (389), synthesized high-path PDM transition stream (390) into and out of the low-path PDM stream (334) and the high-path PDM stream (333), respectively.

FIG. 3D shows an example of a 20 Hz sine wave as an analog signal source (101), low-path PDM stream (382), side-chain PCM path (387) to PCM processing block (399). The analog waveform is internally (399) represented in multi-bit PCM format, but shown in FIG. 3D in an analog wave format for clarity. A rapidly rising level of side-chain PCM path (387) will reach the transition threshold level (377) that has been pre-defined, for a transition event to occur. For an example of a transition threshold level in an embodiment, we will use the low-path PDM stream (382) and side-chain PCM path (387) represented as 0 dBu (i.e., which, referring to an earlier discussion of ADC-side adaptive level adjustments, equals an analog signal source (101) of −60 dBu.) When rising input signal on the side-chain PCM path (387) (represented on FIG. 3D as a 20 Hz sine wave) reaches an equivalent level of 0 dBu as measured by PCM processing block (399), and as shown on FIG. 3D as a transition threshold level (377), PCM processing block (399) will immediately prepare for a transition event. The beginning of a transition event is depicted on FIG. 3B by the left tip of bracket (Tt). At this point in time forward, the PCM processing block (399) will perform these functions. First, retrieve all FIFO-memory-stored incoming signal data stream via side-chain PCM path (387) back to the most recent zero-crossing marker, shown on FIG. 3D as zero-crossing point (379). Second, duplicate (synthesize in PCM data) stored representative waveform on the side-chain PCM path (387) starting from or near the zero-crossing point (379) that was most recent, and moving forward by time period Tt, saving in active buffer memory the synthesized waveform signal over a period Tt (the synthesized waveform of period Tt will be referenced as signal WT1 saved internally to the processor (302), and PCM processing block (399) active buffer memory). Third, process via PCM processing block (399) saved synthesized signal WT1 so it creates a second saved synthesized signal, synchronous in time and identical in representative waveform to signal WT1, referenced as signal WT2. Fourth, level process via PCM processing block (399) both signals WT1, WT2 so it creates the synthesized low-path PCM stream (393) that has a representative level identical to level of the side-chain PCM path (387) as shown on FIG. 3D (which begins at or near zero-crossing point (379)), and that creates a synthesized high-path PCM stream (394) that is identical but with a beginning representative level of zero or null output. Fifth, when the low-path PDM stream (334) of FIG. 3B reaches a point in time equal to the beginning point of time Tt+20 ms (i.e., the beginning point of time depicted by the left tip of bracket of the transitional event period (399*a*), and also by the bottom end of dashed line (382*b*)), the PCM processing block (399) of the processor (302) will initialize a transitional event, whereby both switching elements (397), (398) are placed into a transitional state (described elsewhere). Sixth, at the moment when switching elements (397), (398) are placed into a transitional state, the synthesized low-path PCM stream (393) and the synthesized high-path PCM stream (394) will be at or near a zero-crossing (from the zero-crossing point (379)), with synthesized high-path PCM stream (394) high-path data level starting at null or zero level, and low-path data level starting at full level, equivalent to side-chain PCM path (387) of FIG. 3D.

Referring to FIG. 3A, synthesized low-path PCM stream (393) and the synthesized high-path PCM stream (394) will be sent to processor (302) PCM-to-PDM conversion block (391), synthesized low-path PDM transition stream (389), switching element (398), low-path PDM stream (334), PCM-to-PDM conversion block (392), synthesized high-path PDM transition stream (390), switching element (397), the high-path PDM stream (333), respectively, replacing direct data on the low-path PDM stream (375) and the high-path PDM stream (374) with synthesized low-path PDM transition stream (389), and synthesized high-path PDM transition stream (390), the synthesized data being synchronous in time and identical or effectively identical in representative waveform with the original direct data (but with synthesized level differentials, as just described). Seventh, synthesized low-path PDM transition stream (389), and synthesized high-path PDM transition stream (390), at the beginning of the transitional event period (399a), will both be switched in at or near the moment of their original zero-crossing, the zero-crossing point (379), or in any timing manner that results in a perceptively continuous, glitch-free and linear transition from direct signals on the high-path PDM stream (374) and the low-path PDM stream (375) to synthesized low-path PDM transition stream (389), and synthesized high-path PDM transition stream (390) at the high-path PDM stream (333) and the low-path PDM stream (334), respectively. Eighth, after the initial, glitch-free transition from direct signal output on the high-path PDM stream (374) and the low-path PDM stream (375) to synthesized low-path PDM transition stream (389), and synthesized high-path PDM transition stream (390), the remainder of the transitional event period (399a) of FIG. 3B will be characterized by PCM processing (399) dynamically (i.e., continuously active over the transitional event period (399a) time period), reducing signal level of synthesized low-path PCM stream (393) and the synthesized low-path PDM transition stream (389) while increasing signal level of the synthesized high-path PCM stream (394), synthesized high-path PDM transition stream (390) in an identical but inverse manner, so the net perceived level at the summed output (365) of FIG. 3 of the synthesized low-path PDM transition stream (389) and the synthesized high-path PDM transition stream (390) results in a glitch-free, perceptively constant loudness signal accurately representative of the level dynamics of the analog signal source (101) of FIG. 1 over the transitional event period (399a). Ninth, the end-point of the transitional event period (399a), depicted by the right tip of bracket of the transitional event period (399a) of FIG. 3B and also by the bottom of dashed line (381a), occurs when synthesized low-path PCM stream (393) and synthesized low-path PDM transition stream (389) has been reduced to zero or null state and signal level of the synthesized high-path PCM stream (394) and the synthesized high-path PDM transition stream (390) has been increased to full level, equivalent to level of the side-chain PCM path (387) of FIG. 3D. Tenth, at the point in time where synthesized low-path PCM stream (393) and the synthesized low-path PDM transition stream (389) reaches zero or null state and synthesized high-path PCM stream (394) and the synthesized high-path PDM transition stream (390) achieves full level, the PCM processing block (399) of the processor (302) will change the switching elements (398), (397) from transitional state to high-path-direct state, i.e., the switching state opposite to that shown in FIG. 3A. Eleventh, at the moment when switching elements (397), (398) are placed into a high-path-direct state, high-path direct data via the high-path PDM stream (374) will replace the data from the synthesized high-path PDM transition stream (390) in a continuous, glitch-free and linear manner synchronous in time and identical or effectively identical in representative waveform with the just-replaced synthesized data, while switching elements (398) will remain "off" with a zero or null output, so the low-path DAC output (344) of low-path PDM DAC (304) is zero. Twelfth, as a high-path PDM stream (381), (374), the high-path PDM stream (333) becomes lower in level so it reaches a point requiring a high-path to low-path transitional event, the above sequence (i.e. steps one through eleven) is effectively reversed, with those skilled in the art now having suitable disclosure to understand the technical particulars required for a downward transitional even.

During a transitional event, the absolute representative levels of low-path PDM stream (382), (375), (334) and high-path PDM stream (381), (374), the high-path PDM stream (333) are different; a result of ADC-side adaptive path-level-mapping, discussed elsewhere. Hence, the high- and low-path dynamic level-shift inversion carried out during the transitional event period (399a) may properly represent different absolute path levels, while maintaining properly proportionate relative levels. As described elsewhere, after DAC-side adaptive decoding or un-mapping is complete the high-path output (335), low-path output (336), and summed output (365) analog signals are returned to their analog signal source (101) levels.

The duration of the transition state is not critically fixed at any particular timing, and will be subject to practical design variables. A description of the Tt timing-related design variables is not critical, as the timing-related design variables will now be generally understood to those skilled in the art. The duration of the transition state will be kept short (i.e., no longer than required to monitor the lowest desired program frequency) while achieving the transition state objectives presented a perceptively continuous, linear and glitch-free transition of PDM signal paths (i.e., from low to high, or from high to low) that delivers an analog program signal output at the summed output (365) that represents a faithful, linear, relatively distortion-free reproduction of analog signal source (101).

Figure 3E:
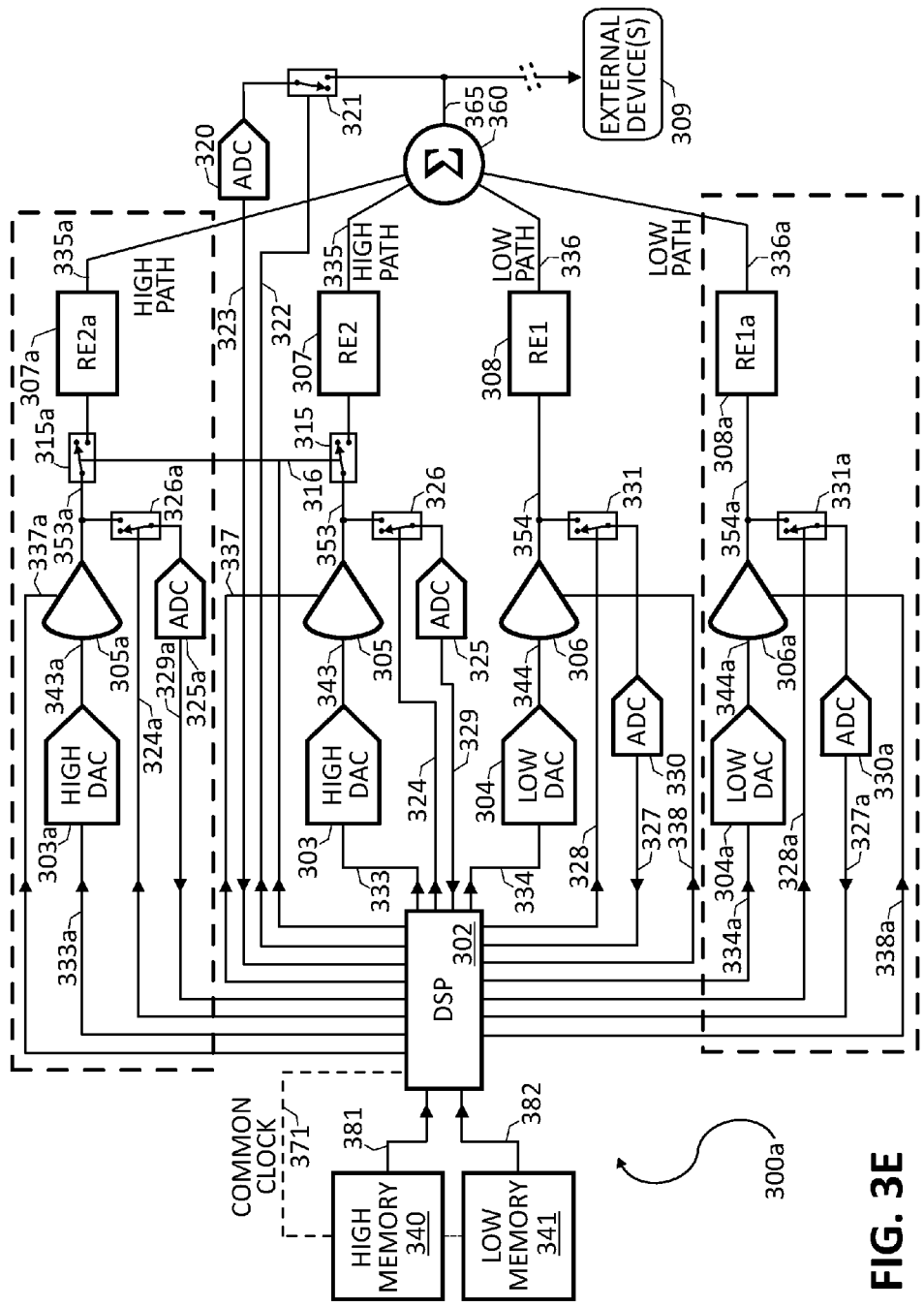
FIG. 3E shows a block diagram of a DAC which duplicates the low-range path and high-range path.
Figure 3F:
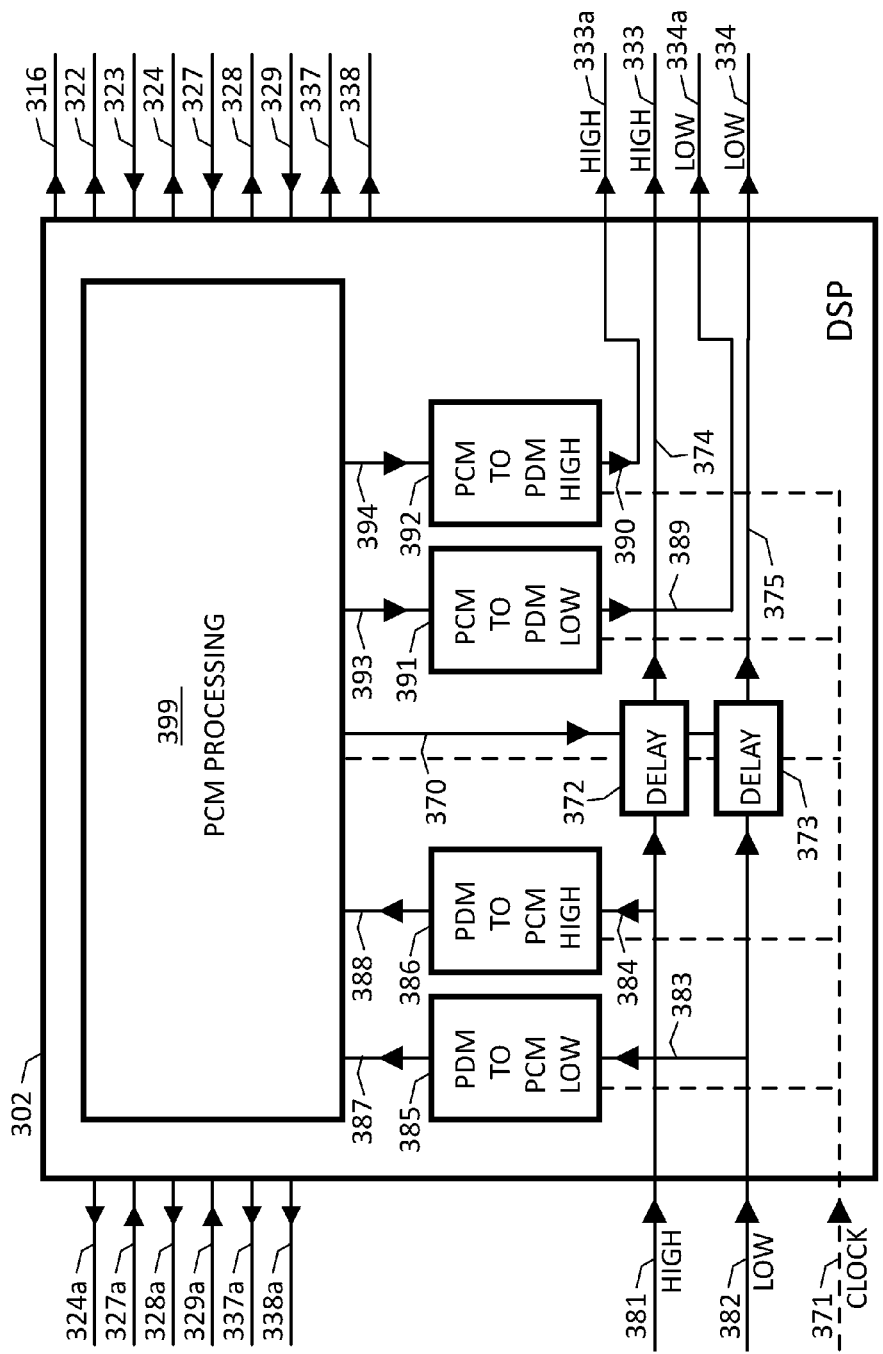
FIG. 3F shows the functional blocks and signal flow of an alternate DSP.

According to a first alternate embodiment, rather than processor (302) switching its low-path PDM stream (334) and the high-path PDM stream (333) between direct signals on the high-path PDM stream (374) and the low-path PDM stream (375) and synthesized low-path PDM transition stream (389), and synthesized high-path PDM transition stream (390), via switching elements (398), (397), the switching elements (398), (397) of FIG. 3A can be removed. Referring to FIGS. 3E and 3F, in place of the switching elements (398), (397) of FIG. 3A, the processor (302) will drive two sets of high-path and low-path DAC sections, as shown by multi-path D-A conversion system (300a) in FIG. 3E as high-path PDM DAC (303), (303a) and low-path PDM DAC (304), (304a), driven with the high-path PDM stream (333), the high-path PDM stream (333a), the low-path PDM stream (334), the low-path PDM stream (334a), respectively. D-A path-related functions (e.g., DAC devices, gain modification devices, resistive elements, high-path(s) switching, ADC path feedback and selection switching) are duplicated for both the low-path and high-path, as shown on FIG. 3E enclosed in dashed line boxes. ADCs (320), (325), (330), ADC outputs (323), (327), (329), low-path PDM DAC (304), low-path DAC output (344), low-path gain modification device (306a), low-path resistive element (308), low-path gain modification device output (354), low-path output (336), high-path PDM DAC (303), high-path DAC output (343), high-path gain modification device (305), high-path resistive element (307), high-path gain modification device output (353), high-path output (335), summing node (360), summed output (365), external device (309), switching elements (321), (326), (331), and control signal paths (316), (322), (324), (328), (337), (338) all function as described in FIG. 3 and remain unchanged.

In FIGS. 3E and 3F, the synthesized low-path PDM transition stream (389), and synthesized high-path PDM transition stream (390) of FIG. 3F is routed to a high-path PDM stream (333a) and the low-path PDM stream (334a) which are the outputs for the transitional state PDM signals. When a transitional event is triggered, synthesized low-path PDM transition stream (389) of FIG. 3F, and synthesized high-path PDM transition stream (390) drive outputs of the low-path PDM stream (334a) and the high-path PDM stream (333a) with transitional state synthesized PDM signals, respectively, while at the same moment that processor (302) nulls the low-path PDM stream (334) and the high-path PDM stream (333) via control signal (370) of FIG. 3F controlling a null or off function of the time delay (372), (373) of FIG. 3F (i.e., the input data to a FIFO delay, for example, will continuously accumulate normally, but the high-path PDM stream (374) and the low-path PDM stream (375) will be muted or switched off.) One benefit of this alternate embodiment is the speed at which transitional data replacement can occur, which is effectively instantaneous, limited to the baseline operating parameters of the processor (302), and resulting from the fact that no single-output-path replacement switching takes place. The manageable interchange timing at which the transitional state signals of the low-path PDM stream (334a), the high-path PDM stream (333a) and direct state signals of the low-path PDM stream (334), the high-path PDM stream (333) are appended, which using conventional DSP devices can be in the pico-seconds, and the manner in which the signals are appended (typically, but not exclusively, at or near a zero-crossing of the represented analog signal; an analog zero-crossing is generally represented in "1-bit" PDM data as a time-symmetrical square wave having equal pulse width for both square wave half-cycles, which can lend beneficial timing characteristics to the appending of data paths during a PDM-represented zero-crossing), assures a perceptively continuous and glitch-free transition at the beginning and end of transition state events in this alternative embodiment.

In FIG. 3F, the synthesized low-path PDM transition stream (389) and the synthesized high-path PDM transition stream (390) are produced in the same manner as described for FIG. 3A using side-chain PDM paths (383), (384), PDM-to-PCM conversion blocks (385), (386), side-chain PCM paths (387), (388), PCM processing block (399), synthesized low-path PCM stream (393), synthesized high-path PCM stream (394), and PCM-to-PDM conversion blocks (391), (392).

Figure 3G:
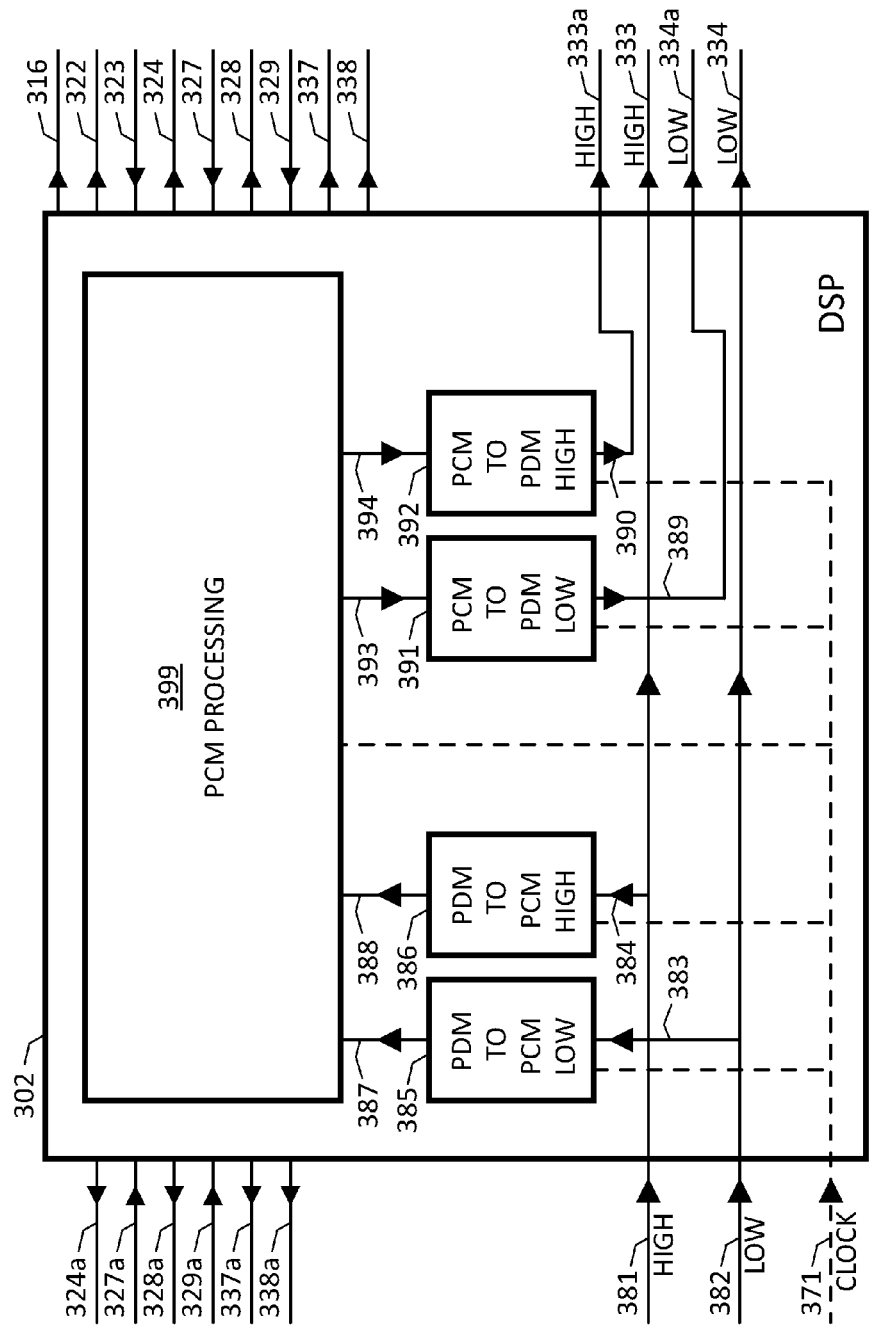
FIG. 3G shows the functional blocks and signal flow of an alternate DSP.

The D-A low-path and high-path devices in FIG. 3E are duplicated and referenced with "a" suffix numerals, including ADCs (325a), (330a), low-path PDM DAC (304a), low-path DAC output (344a), low-path gain modification device (306a), low-path resistive element (308a), low-path gain modification device output (354a), low-path output (336a), high-path PDM DAC (303a), high-path DAC output (343a), high-path gain modification device (305a), high-path resistive element (307a), high-path gain modification device output (353a), high-path output (335a), ADC outputs (327a), (329a), and control signal paths (324a), (328a), (337a), (338a). ADC outputs (327a), (329a) and control signal paths (324a), (328a), (337a), (338a) are also shown in FIGS. 3F and 3G. In some implementations of FIG. 3E, some devices may be shared for use during transitional events. For instance, the low-path DAC output (344) of low-path PDM DAC (304) and the low-path DAC output (344a) may be connected in parallel with the low-path DAC output (344), eliminating the need for any additional transitional low-path devices (e.g., devices and signals such as ADC (330a), low-path gain modification device (306a), low-path resistive element (308a), low-path gain modification device output (354a), low-path output (336a), control signal paths (338a), (328a) may be removed). Similarly, low-path PDM stream (334) and (334a) could drive a single DAC and DAC path (e.g., such as the low-path PDM stream (334) as shown in FIG. 3) with PCM processing block (399) of the processor (302) managing a continuous, linear, and perceptively glitch-free transition between low-path PDM stream (334) and (334a). The same manner of device sharing and removal may be employed in the "a-suffixed" high-path, employing a similar manner of signal transition between paths.

According to a second alternate embodiment, as shown in FIG. 3G, the time delay (372), (373) of FIGS. 3A, 3F, 3H, and 3I is removed from processor (302). In FIG. 3G, the processor (302), including PCM processing block (399), may be of sufficiently high switching and processing speed and sufficiently low propagation delay so the time delay (372), (373) of FIGS. 3A, 3F, 3H, and 3I may not be needed to achieve perceptively glitch-free and linear transitional events. The high-path PDM stream (381) and the low-path PDM stream (382) directly feed the high-path PDM stream (333) and the low-path PDM stream (334), respectively. The PCM processing (399) will, based on the rise time and amplitude represented by high-path PDM stream (381) and low-path PDM stream (382), determine, within a minimum number of PDM-based clock cycles from clock signal (371), the possible or probable need for a transitional event, details of which are described elsewhere. The transitional event will be carried out in the manner described for FIG. 3F with the PCM-to-PDM conversion block (391) producing synthesized low-path PDM transition stream (389) with corresponding low-path PDM stream (334a) and the PCM-to-PDM conversion block (392) producing synthesized high-path PDM transition stream (390) with corresponding high-path PDM stream (333a). Because the side-chain monitor of the side-chain PDM paths (383), side-chain PDM paths (384), PDM-to-PCM conversion blocks (385), (386), side-chain PCM paths (387), (388), the synthesized low-path PCM stream (393) and the synthesized high-path PCM stream (394), PCM processing block (399), synthesized low-path PDM transition stream (389), and synthesized high-path PDM transition stream (390), PCM-to-PDM conversion blocks (391), (392), and control signal path (316) are working effectively in real-time (i.e., no dedicated delaying functions), some false or unnecessary transition events may occur. Whether the transition event was ultimately justified or not (i.e., whether the anticipated signal level rose above, or fell below, the path-level crossover threshold as anticipated) will be unimportant since PCM processing (399) is continually monitoring the high-path PDM stream (381), side-chain PCM path (388), and the low-path PDM stream (382), and side-chain PCM path (387) and will sense that an anticipated path-level did or did not actually occur as anticipated. If an anticipated path-level did not actually occur, the PCM processing (399) will immediately trigger another transition state which returns the active direct signal back to the properly-oriented signal path (i.e., the active signal path of the direct signal before the non-required transition state occurred.)

Figure 3H:
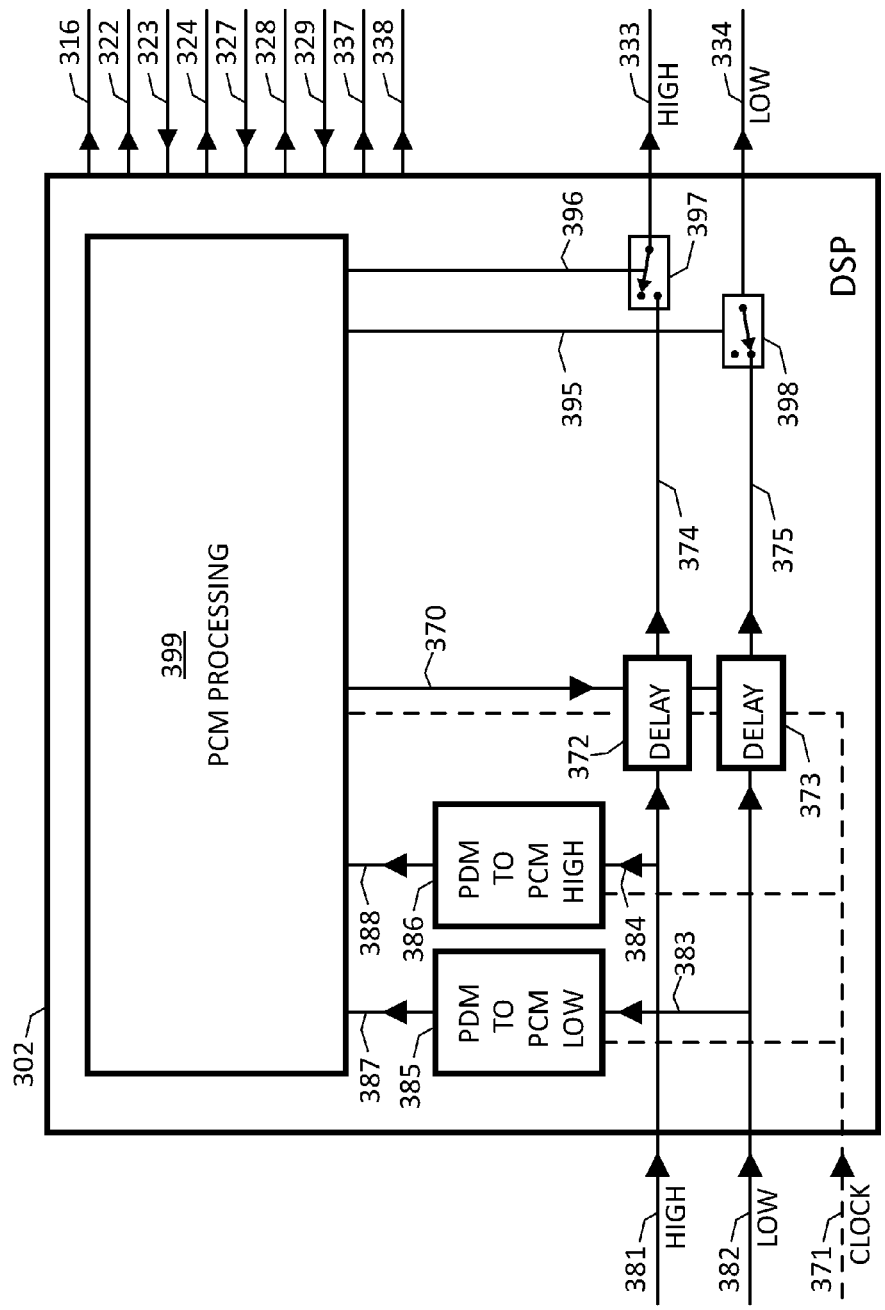
FIG. 3H shows the functional blocks and signal flow of an alternate DSP.

According to a third alternate embodiment, as shown in FIGS. 3 and 3H, the PCM-to-PDM conversion section of FIGS. 3A, 3F and 3G synthesized low-path PDM transition stream (389), synthesized high-path PDM transition stream (390), PCM-to-PDM conversion blocks (391), (392), synthesized low-path PCM stream (393), and synthesized high-path PCM stream (394) have been removed. The high-path PDM stream (381) and low-path PDM stream (382) are continuously monitored by PCM processing block (399) of the processor (302) of the high-path PDM stream (381) and the low-path PDM stream (382) from side-chain PCM paths (388), (387) of the PDM-to-PCM conversion blocks (386), (385) via side-chain PDM paths (384), (383) as described elsewhere. The direct-path PDM input signals feed a time delay (373), (372) with a one-or-both-path muting function from control signal (370) under control of PCM processing block (399) of the processor (302). PCM processing block (399) of the processor (302) uses level data from side-chain PCM paths (387), (388) to determine precise switch control timing of control signal paths (395), (396), and corresponding switching elements (397), (398). The high-path PDM stream (333) and the low-path PDM stream (334) feed the D-A paths on FIG. 3. All processor (302) functional i/o lines are as shown on FIGS. 3 and 3H.

In a third alternate embodiment in FIG. 3H, the switching of high-path PDM stream (381), (374), and the low-path PDM stream (382), (375) by series-path gates or switching elements (397), (398), respectively, is managed by PCM processing block (399) of the processor (302). PCM processing block (399) of the processor (302) is configured to continuously monitor input levels of the high-path PDM stream (381), the side-chain PCM path (388), the low-path PDM stream (382), the side-chain PCM path (387). In FIG. 3H, switching elements (397), (398) can be operated in three states. The three possible switching states will be called low-direct, high-direct, and transitional. When an analog signal source (101) of FIG. 1, high-path PDM stream (381), and low-path PDM stream (382) is of relatively low-level, as determined by PCM processing block (399) of the processor (302) monitoring, PCM processing block (399) of the processor (302) will maintain switching elements (397), (398) in low-direct state, which is the switching orientation in FIG. 3H (i.e., low-path PDM stream (334) is on, the high-path PDM stream the high-path PDM stream (333) is off). When a high-path PDM stream (381) and low-path PDM stream (382) is of relatively high-level, as determined by PCM processing block (399) of the processor (302) monitoring, PCM processing block (399) of the processor (302) will maintain switching elements (397), (398) in high-direct state, which is the opposite of switching orientation in FIG. 3H (i.e., low-path PDM stream (334) is off, the high-path PDM stream (333) is on). When a low-path PDM stream (382), (375), (334) (i.e., low-direct state) of increasing level, or a high-path PDM stream (381), (374), the high-path PDM stream (333) (i.e., high-direct state) of decreasing level, reaches a predetermined path transition level, as determined by processor (302), PCM processing block (399) will switch the orientation of switching elements (397), (398) in such a manner to affect a perceptibly continuous, glitch-free and linear path-level transition (i.e., the transitional state). The time delay (372), (373) is set to a sufficient time delay period to allow PCM processing block (399) of the processor (302) to sample the input signal level of the side-chain PCM path (387), (388) continuously, to determine continuously whether a transitional state event is required, and, if required, to execute the required transition at a precisely determined time. The transitional switching characteristic may be carried out in a make-before-break mode, where both switches are momentarily on during the transition event, or in a simultaneous mode, where both switches change state at effectively the same moment of a transition event. In either case, the transition switching point, or switching period, will cause a path change so it is perceptively continuous, glitch-free and linear.

Figure 3I:
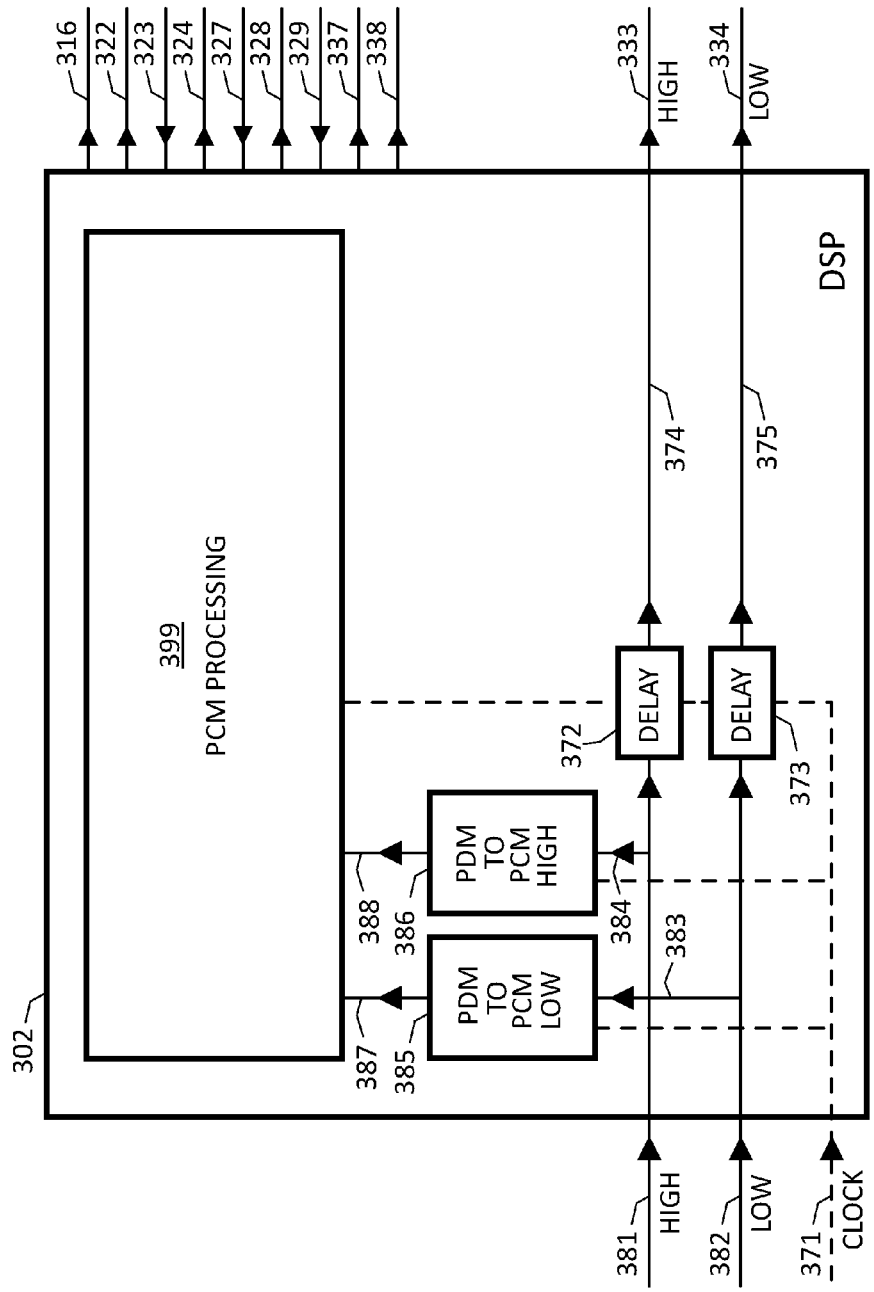
FIG. 3I shows the functional blocks and signal flow of an alternate DSP.
Figure 3J:
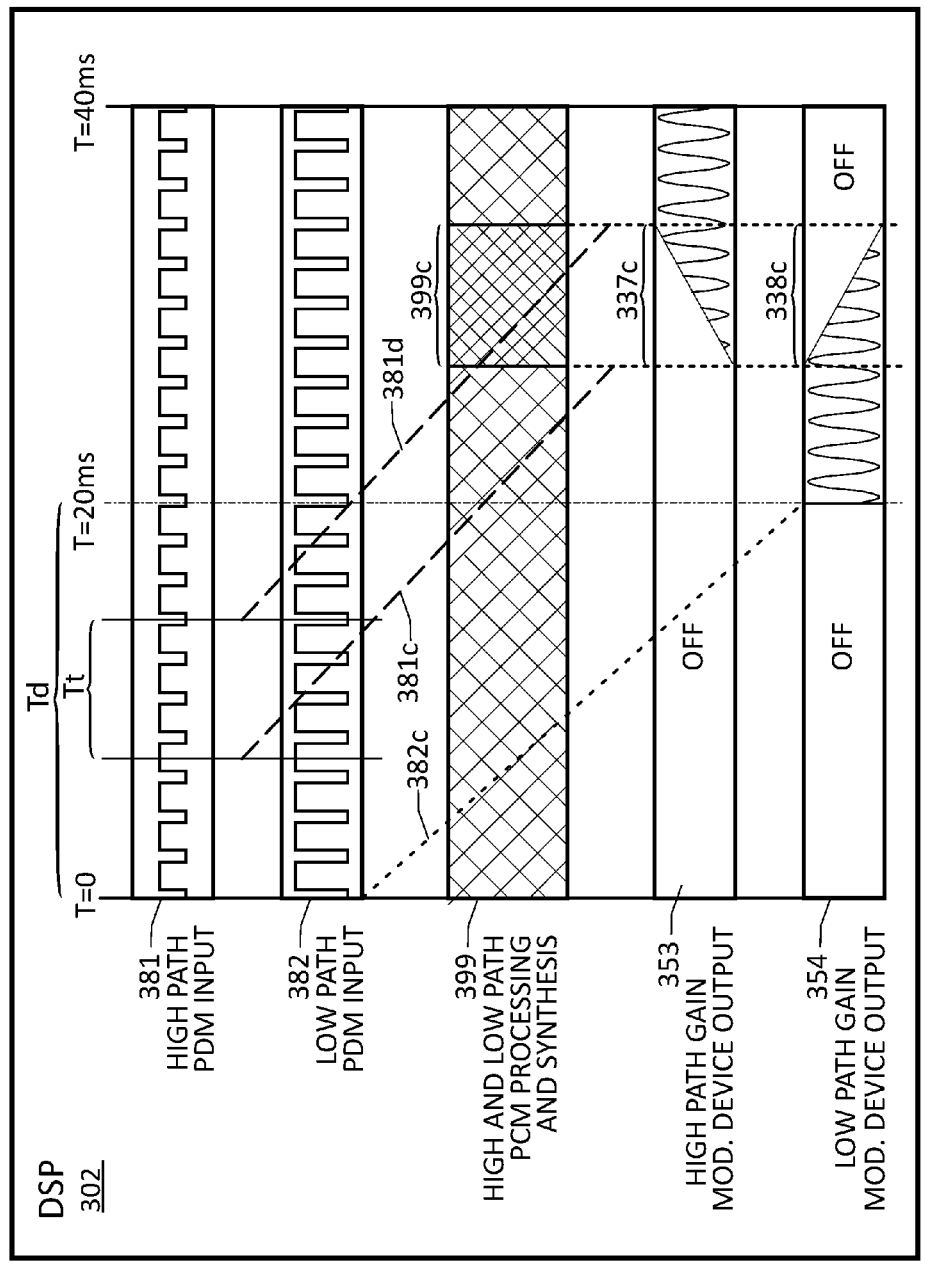
FIG. 3J shows the timing, delay, and transitional state characteristics of the alternate DSP input and output signals in FIG. 3I.

To potentially reduce the transition state processing load on the DSP, a fourth alternate embodiment is now given, as shown in FIGS. 3I and 3J. Referring to FIGS. 3I and 3J, in the fourth alternate embodiment, the analog gain levels of high-path gain modification device (305) and low-path gain modification device (306) of FIG. 3, the gain levels being individually managed by digital control via PCM processing block (399) of the processor (302), can be dynamically and individually adjusted by control signal paths (337), (338) at and/or around the timing of a transition event. One example of a low-path to high-path transition event using DSP-controlled (i.e., digitally-controlled) analog level adjustment is now given.

Recalling from FIG. 3B the method in which PCM processing block (399) of the processor (302) uses the delay and look-ahead period (Td) to monitor the incoming signal, and to detect a level of the incoming signal that will trigger a transitional event, and to prepare and synthesize a transitional event cycle in advance (Tt), the fourth alternate embodiment uses similar delay and look-ahead period as part of a methodology to digitally adjust control signal paths (337), (338) of the high-path gain modification device (305) and low-path gain modification device (306) levels at and/or around a transition event. Referring to FIGS. 3I and 3J, when a relatively low-level input signal (i.e., the low-direct state is active) of increasing level reaches a predetermined path transition level, as determined by PCM processing block (399) of the processor (302), and represented generally by the transition threshold level (377) of FIG. 3D, PCM processing block (399) of the processor (302) will prepare a transitional event (Tt). The PCM processing block (399) receives the high-path PDM stream (381) and the low-path PDM stream (382) from side-chain PCM paths (388), (387) of the PDM-to-PCM conversion blocks (386), (385) via side-chain PDM paths (384), (383). A detailed description of the transitional state method and process of the fourth alternate follows. First, PCM processing block (399) of the processor (302) marks in its memory the specific point in time (relative to a systemic master clock, such as (371) in FIGS. 3A, 3E-3I, and 3K) at which point the high-path PDM stream (381) and low-path PDM stream (382) rises to a predetermined level that will trigger a transitional event state. Second, as shown by FIGS. 3, 3I and 3J, beginning at time 20 ms (T=20 ms), the delayed (373) low-path PDM stream (382) that started at T=0 flows into the multi-path D-A conversion system (300), as indicated by the bottom of dashed line (382c) of FIG. 3J, and shown as a continuous analog waveform of the low-path gain modification device output (354). Third, when the delayed, DA-converted, low-path analog data stream of the low-path gain modification device output (354) of FIG. 3J reaches a point in time equal to the beginning point of time period Tt+20 ms, the point of time depicted by the left tip of brackets of transitional event periods (399c), (337c), (338c), and also by the bottom end of dashed line (381*c*), the PCM processing block (399) of the processor (302) will initialize a transitional event. Fourth, at the beginning of the transitional event, depicted in FIG. 3J by the left tip of brackets of transitional event periods (399*c*), (337*c*), (338*c*), and also by the bottom end of dashed line (381*b*), PCM processing block (399) of the processor (302) will send control signals on the control signal paths (337), (338) to high-path gain modification device (305) and low-path gain modification device (306), respectively, the control signals beginning a process of high-path gain modification device (305) and low-path gain modification device (306) the signals of the high-path gain modification device output (353) and the low-path gain modification device output (354) relative to summing node (360) of FIG. 3. Any suitable method of digitally-controlled analog adjustment, such as digitally-controlled analog resistance elements, can be utilized, as understood by one skilled in the art. Fifth, during the transitional event, which in the fourth alternate embodiment is also the complete duration of a crossfade process, as indicated by brackets of transitional event periods (399*c*), (337*c*), (338*c*), the signal of the low-path gain modification device output (354), under level control of PCM processing block (399), of processor (302) via control signal path (338), will begin its transitional state at full level and immediately decrease in level and will continue to decrease in level over the entire transitional state until the signal of the low-path gain modification device output (354) has been reduced to zero level (i.e., low-path gain modification device (306) is effectively off), depicted by the right tip of bracket of the transitional event period (338*c*). Sixth, during the transitional event, which in the fourth alternate embodiment, is also the complete duration of the crossfade process, as indicated by brackets of transitional event periods (399*c*), (337*c*), (338*c*), the signal of the high-path gain modification device output (353) of FIG. 3, under level control of PCM processing block (399) of processor (302) via control signal path (337), will begin its transitional state at zero level (i.e., high-path gain modification device (305) of FIG. 3 is effectively off) and immediately increase in level and will continue to increase in level over the entire transitional state until the signal of the high-path gain modification device output (353) of FIG. 3 is at, and remains at, full level (i.e., low-path gain modification device (306) of FIG. 3 is effectively off), depicted by the right tip of bracket of transitional event periods (337*c*). This is related to the end of the transitional period Tt by dashed line (381*d*). Seventh, the term "full level," used in the previous descriptions, refers to the non-transitional, steady-state operating level of the low-direct-path or high-direct-path signal, depending on which path is active. Eighth, during a transitional event period (399*c*), (337*c*), (338*c*), the analog level measured at summed output (365) of FIG. 3 will remain proportional to the analog signal source (101) of FIG. 1 (i.e., the crossfade period will cause a perceptively continuous and linear analog signal at the summed output (365) of FIG. 3 before, during, and after the transitional (crossfade) period.) Ninth, a high-path PDM stream (381), (374), the high-path PDM stream (333) decreases in level so it reaches a point requiring a high-path to low-path transitional event, the above nine steps are effectively reversed, with those skilled in the art now having suitable disclosure to understand the technical particulars required for a downward (high-path to low-path) transitional event.

Figure 3K:
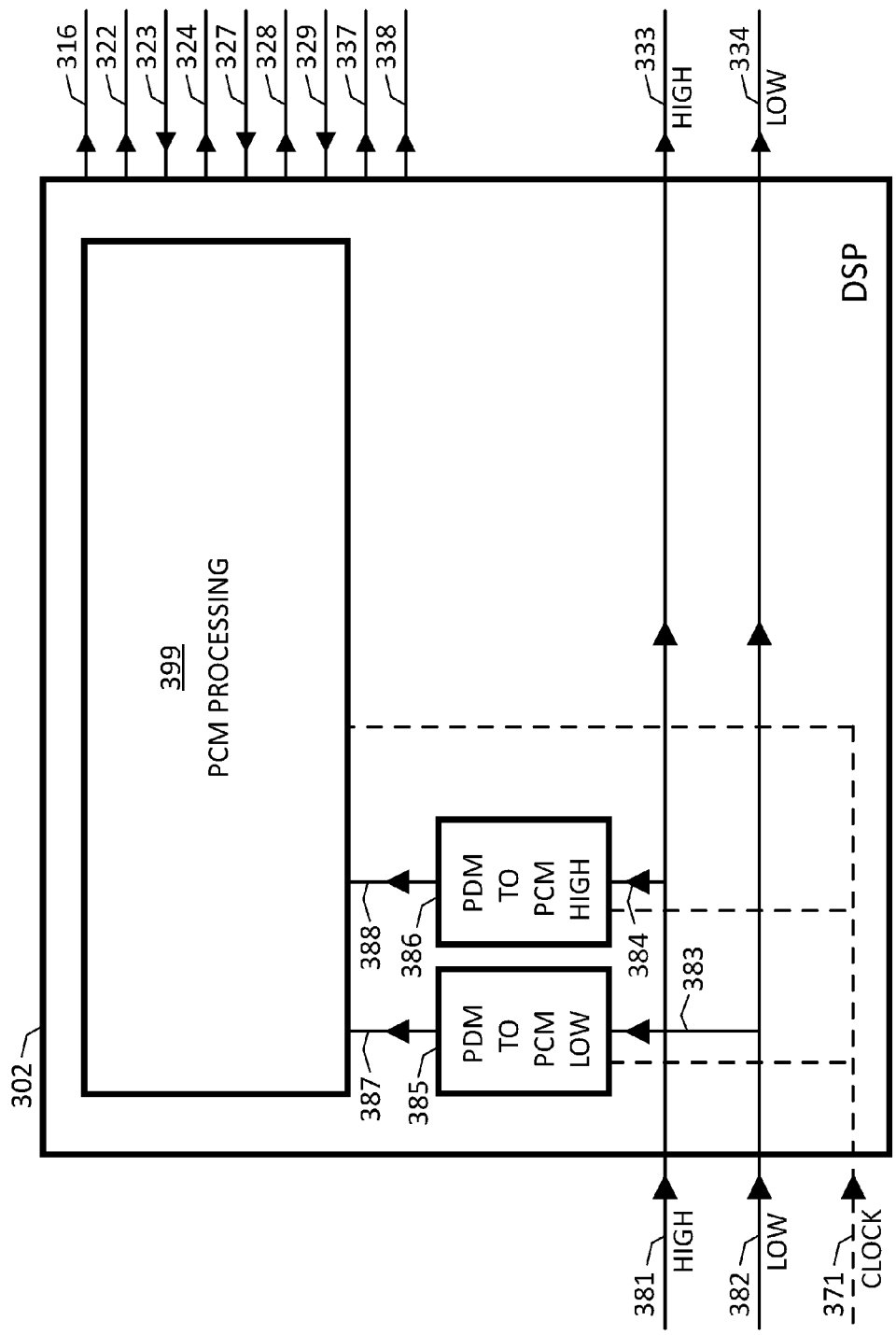
FIG. 3K shows the functional blocks and signal flow of an alternate DSP.

In an alternate embodiment to the fourth alternate embodiment, FIG. 3K shows processor (302) with time delay (372), (373) removed and the high-path PDM stream (381) and low-path PDM stream (382) are routed directly to high-path PDM stream (333) and low-path PDM stream (334), respectively with the processor carrying out the crossfade event by controlling an analog crossfade. High-path PDM stream (381) and low-path PDM stream (382) are received into processor (302) and output from processor (302) in real-time to the high-path PDM stream (333) and the low-path PDM stream (334) with only normal propagation delays associated with digital signal processing. In this alternate embodiment, the processor (302), including PCM processing block (399), will be of sufficiently high switching and processing speed and sufficiently low propagation delay so a time delay (372), (373) is not required to achieve perceptively glitch-free and linear transitional events. In this alternate embodiment, a transitional crossfade processing decision and execution state are made in real-time by PCM processing block (399). A transition event decision is made by PCM processing block (399) by anticipating a probable need for a transitional crossfade based on the rate of change and absolute level in time of high-path PDM stream (381), the side-chain PCM path (388), the low-path PDM stream (382), and the side-chain PCM path (387). PCM processing (399) will, based on the rise time and amplitude represented by high-path PDM stream (381) and the low-path PDM stream (382), determine, within a minimum number of PDM-based clock cycles of the clock signal (371), the (probable) need for a transitional analog crossfade event, and carry out the transitional event in the manner described by the fourth alternate embodiment. In this present alternate embodiment, because the side-chain monitor, processing and the control signal path (316), (337), (338), the side-chain PDM paths (383), (384), the PDM-to-PCM conversion blocks (385), (386), the side-chain PCM paths (387), (388), and the PCM processing block (399) are working effectively in real-time (i.e., no dedicated delaying functions), some false or unnecessary transition events may occur. Whether the transition event was ultimately justified or not (i.e., whether the anticipated signal level rose above, or fell below, the path-level crossover threshold as anticipated) will be unimportant since the PCM processing block (399) is continually monitoring the high-path PDM stream (381) and low-path PDM stream (382) and will sense that the anticipated path-level did or did not actually occur as anticipated. If an anticipated path-level did not actually occur, the PCM processing (399) will immediately trigger another transition crossfade state which returns the active direct signal back to the properly-oriented signal path (i.e., the active signal path of the direct signal before the non-required transition state occurred.)

FIG. 3 shows that the processor (302), the high-path PDM stream (333), the low-path PDM stream (334), the high-path PDM DAC (303), and the low-path PDM DAC (304). The high-path DAC output (343) and the low-path DAC output (344) of each of the high-path PDM DAC (303), the low-path PDM DAC (304) is sent to the high-path gain modification device (305) and the low-path gain modification device (306), respectively. Typically, integrated circuit DAC outputs are differential, but the novel multi-path PDM conversion system is not limited to differential signal paths and can employ differential or single-ended signal paths. The high-path gain modification device (305) and low-path gain modification device (306) can provide several functions, including current-to-voltage conversion (IV conversion), high and/or low frequency filtering, DC servo, current buffering/current sourcing, voltage gain, and impedance buffering. The high-path gain modification device (305) and low-path gain modification device (306) should include sufficiently low noise, sufficiently low output impedance, sufficiently high output current, and sufficiently high output voltage to properly interface with a summing node (360) which combines the low-path and high-path signals into a single analog signal capable of driving an external devices (309) to a sufficiently high-level and wide bandwidth, while maintaining sufficiently low noise and distortion. According to an alternate embodiment, the passive analog summing could be implemented using one or more audio signal transformers.

Although the signals on the high-path output (335), the low-path output (336), and the summed output (365) are assigned distinct reference numerals, the summing node (360)—which physically is simply where the conductive paths from the output of the high-path resistive element (307), the output of the low-path resistive element (308), and the input to the external device (309) meet—makes those signals electrically connected. Since the high-path output (335), the low-path output (336), and the summed output (365) are electrically connected with no intervening circuitry, their corresponding signals are inherently the same at all instants. Distinct reference numerals are used for clarity of discussion. The signal on the high-path output (335) is the portion of the signal on the summed output (365) that is generated by the high-path PDM DAC (303), the high-path gain modification device (305), and the high-path resistive elements (307). The signal of the low-path output (336) is the portion of the signal on the summed output (365) that is generated by the low-path PDM DAC (304), low-path gain modification device (306), low-path resistive element (308).

While high-path PDM DAC (303), low-path PDM DAC (304) can each be operated over a relatively wide dynamic range, limited only to their inherent minimum noise and maximum level specification, for example, we require low-path PDM DAC (304) to facilitate 80 dB of usable conversion range and we require high-path PDM DAC (303) to facilitate no greater than 116 dB of usable conversion range. Although sometimes audio program signals below a noise threshold can be psychoacoustically perceived, for example in the present specification it is assumed that the measured broadband (for example, 20 Hz-20 kHz measurement bandwidth), unweighted (i.e., no frequency-amplitude weighting filters) DAC noise floor will be equal to the lowest usable DAC signal level. The downstream remapping or decoding process may require that high-path gain modification device (305) and low-path gain modification device (306) and high-path resistive element (307) and low-path resistive element (308) perform certain level adjustments or level functions which result in the high-path output (335) exhibiting an analog level range of −50 dBu to +30 dBu and the low-path output (336) exhibiting an analog level range of −130 dBu to −50 dBu. To describe an example of the methodology whereby the level ranges on the high-path output (335) and the low-path output (336) are achieved, we first characterize the gain modification device configurations in FIG. 1. In the A-D conversion embodiment of FIG. 1, low-path gain modification device (106) is shown with a gain of +60 dB. At this gain level, we will assume that low-path gain modification device (106) exhibits a broadband, unweighted self-noise at the low-path gain modification device output path (113) of −70 dBu, which is seen in the vertical bar graph at the low-path gain modification device output path (113) of FIG. 3C, labeled "LOW GMD," as the shaded area rising to a maximum level of −70 dBu. Also in FIG. 1, high-path gain modification device (105) is configured with a fractional gain of −20 dB (a level reduction of −20 dB). At this fractional gain level (level reduction), we will assume that high-path gain modification device (105) exhibits a broadband, high-path gain modification device output path (112) of −106 dBu, which is seen on the high-path gain modification device output path (112) of FIG. 3C, labeled "HIGH GMD," as the shaded area rising to a maximum level of −106 dBu. As shown in FIG. 1, the high-path gain modification device output path (112) and the low-path gain modification device output path (113) high-path PDM ADC (115) and low-path PDM ADC (116). We will assume that high-path PDM ADC (115) and low-path PDM ADC (116) have a maximum operational input level of +10 dBu, and a broadband, unweighted operational noise floor of −112 dBu, for a total usable, broadband, unweighted dynamic range of 122 dB. As shown in FIG. 3C, horizontal dashed lines indicate the usable dynamic data range transfer from low-path gain modification device output path (113) to low-path PDM ADC (116), and high-path gain modification device output path (112) to high-path PDM ADC (115). The low-path PDM ADC (116) is labeled "LOW ADC." The high-path PDM ADC (115) is labeled "HIGH ADC." As shown in FIG. 3C, low-path gain modification device output path (113) can deliver 80 dB of usable signal to low-path PDM ADC (116) in the range −70 dBu to +10 dBu (any signal information below −70 dBu is lost in the self-noise of the gain modification device), while high-path gain modification device output path (112) can deliver 116 dB of usable signal to high-path PDM ADC (115) in the range −106 dBu to +10 dBu (recalling that the high-path PDM ADC (115) and low-path PDM ADC (116) maximum usable input level is +10 dBu). On FIG. 1, the high-path PDM ADC (115) and the low-path PDM ADC (116) send clock-synchronous PDM data via the high-path PDM ADC output path (122) and the low-path PDM ADC output path (123) to memory locations (145), (146), via high-path PDM stream (132) and the low-path PDM stream (133) from processor (125), for storage and later use. Low-path PDM ADC (116) PDM output signal represents an original analog signal in the range −130 dBu to −50 dBu that has been upwardly level-mapped as a signal with the range −70 dBu to +10 dBu, while high-path PDM ADC (115) PDM output signal represents an original analog signal in the range −50 dBu to +30 dBu that has been level-mapped downward as a signal with the range −70 dBu to +10 dBu.

As described elsewhere, from FIGS. 3, 3A and 3B, the embodiment delivers two paths of the high-path PDM stream (333) and the low-path PDM stream (334), via processor (302) processing techniques described elsewhere, to high-path PDM DAC (303) and the low-path PDM DAC (304), respectively. We will assume the high-path PDM DAC (303) and the low-path PDM DAC (304) exhibit a broadband, unweighted operational noise floor of −112 dBu and a maximum (full-scale) operational level of +10 dBu. From FIG. 3C, high-path PDM DAC (303), and the low-path PDM DAC (304), convert level-mapped PDM data (described as PDM data stream from the high-path PDM ADC output path (122), and low-path PDM ADC output path (123), the stored data in memory locations (145), (146) of FIG. 1, the stored data in memory locations (341), (340) of FIG. 3, and ultimately the processed data of the high-path PDM stream (333) and the low-path PDM stream (334) also of FIG. 3). The level ranges processed by high-path PDM DAC (303) and the low-path PDM DAC (304) are shown graphically as vertical bars in FIG. 3C and labeled as labeled "HIGH DAC," and "LOW DAC," respectively. The low-path DAC output (344) of low-path PDM DAC (304) is shown graphically starting at a noise floor of −70 dBu (the shaded vertical bar area under −70 dBu) and rising to a maximum level of +10 dBu. The high-path DAC output (343) of high-path PDM DAC (303) is shown graphically starting at a noise floor of −106 dBu (the shaded vertical bar area under −106 dBu) and rising to a maximum level of +10 dBu. From FIG. 3, low-path and the signals of the low-path DAC output (344) and the high-path DAC output (343), respectively, feed the low-path gain modification device (306) and high-path gain modification device (305), respectively. Low-path gain modification device (306) is configured for unity-gain while high-path gain modification device (305) exhibits +20 dB of gain. As shown on FIG. 3C, low-path gain modification device (306) receives the signal of the low-path DAC output (344), which is an analog signal with a dynamic range of 80 dB and a usable level between −70 dBu and +10 dBu, as represented on FIG. 3C vertical bar for the low-path gain modification device (306) and labeled "LOW GMD." Also shown on FIG. 3C, high-path gain modification device (305) receives the signal of the high-path DAC output (343), which is an analog signal with a dynamic range of 116 dB and a usable level between −106 dBu and +10 dBu. High-path gain modification device (305) exhibits +20 dB of gain, hence its absolute level parameters are shifted upward. As represented on FIG. 3C high-path gain modification device (305), the high-path gain modification device output (353) range, after +20 dB of gain, exhibits a maximum level of +30 dBu with a noise floor given as −86 dBu. The maximum analog output level on the high-path gain modification device output (353), labeled "HIGH GMD," is now +30 dBu, which is identical to the maximum input level of the analog signal source (101) described earlier.

From FIG. 3, high-path gain modification device (305) and low-path gain modification device (306) feed the high-path resistive element (307) and the low-path resistive element (308) via low-path gain modification device output (354) and high-path gain modification device output (353), respectively. From FIG. 3C, low-path resistive element (308) exhibits a bulk series resistance of 100 ohms and an attenuation factor of −60 dB, which is shown by the vertical bar of FIG. 3C labeled "LOW RN." The low-path output (336) from the low-path resistive element (308) will have a dynamic range of 80 dB, an approximate noise floor of −130 dBu and a maximum output level of −50 dBu. Hence, the lower bound of low-path output (336) is −130 dBu, which is identical to the minimum level of the analog signal source (101) described earlier. Also from FIG. 3C, high-path resistive element (307) exhibits a series resistance of 100 ohms and no attenuation, which is shown by the vertical bar of FIG. 3C labeled "HIGH RN." The high-path output (335) from the high-path resistive elements (307) with will have a dynamic range of 116 dB, an approximate noise floor of −86 dBu and a maximum output level of +30 dBu. Hence, the upper bound of high-path output (335) is now seen as +30 dBu, which is identical to the maximum level of the analog signal source (101) described earlier.

Per FIG. 3, the high-path gain modification device output (353) is fed, via high-path switching element (315), to a high-path passive resistive element RE2 (307) (in an alternate embodiment, not shown in FIG. 3, the high-path switching element (315) may follow the high-path resistive elements (307), so the high-path switching element (315) is connected between the high-path resistive element (307) and the high-path output (335)). In another alternative embodiment, the switching element may be configured in shunt, or in multiple switching elements in series and in shunt. The high-path switching element (315) is controlled by a control signal path (316) provided by the processor (302). The low-path gain modification device output (354) of the low-path gain modification device (306) is fed directly to a low-path passive resistive element RE1 (308). The high-path resistive element (307) and low-path resistive element (308) may be transformers, and may perform several functions, including signal boost or attenuation, noise-management, impedance management and frequency filtering, when required. In the examples of FIG. 3, high-path resistive element (307) and low-path resistive element (308) have low series resistance and provide sufficiently low output impedance at the high-path output (335) and the low-path output (336) for proper summing of signals of the high-path output (335) and the low-path output (336) at the summing node (360). According to the embodiment, the resistive elements RE2 (307) and RE1 (308) both exhibit 100-ohm series resistance. Additional frequency filtering (such as high-pass and/or low-pass filtering) can be added to the high-path resistive element (307) and low-path resistive element (308) as required based on the particulars of the the multi-path D-A conversion system (300) and the external device (309). Other series resistance values can be employed in the high-path resistive element (307) and low-path resistive element (308). A lower resistance will provide lower overall output thermal noise while a higher resistance will cause higher overall thermal noise.

The thermal (or Johnson-Nyquist) noise voltage Vn produced by a resistor of resistance R is given by:

$$Vn=(4 \text{ kB } TfR)1/2 \quad (1.1)$$

where kB is Boltzmann's Constant of 1.3806504×10-23 (joule/Kelvin), T is absolute temperature in Kelvin, f is the frequency bandwidth in Hz, and R is the value of the resistance in ohms. Assuming a temperature T of 20 degrees centigrade (293.15° K), a frequency bandwidth of 20,000 Hz, and a total series resistance R of 100 ohms, the full bandwidth, unweighted noise (Vn) is approximately 175 nV RMS or approximately −133 dBu with dBu, calculated by:

$$dBu=20 \text{ Log}_{10}(V_n/0.7746) \text{ with 0 dBu=0.7746 Vrms} \quad (1.2)$$

The summing node (360) is a simple physical electrical connection of the high-path output (335) and the low-path output (336) from the high-path resistive element (307) and low-path resistive element (308), respectively. With sufficiently high source currents at high-path gain modification device output (353), low-path gain modification device output (354), and sufficiently low series resistances of the high-path resistive element (307) and low-path resistive element (308), the summation of the high-path output (335) and the low-path output (336) will properly interface with external devices (309) while maintaining low noise and high dynamic range, as will be further described below.

When the output signal level of the low-path output (336) is below −66 dBu, the high-path switching element (315) under control of processor (302) via control signal path (316) is held open (as depicted in FIG. 3). When this high-path switching element (315) is open, it creates an open-circuit resulting in effectively no thermal noise reaching the summing node (360) via the high-path out (335). When high-path switching element (315) is open, the only noise which is input to the summing node (360) is the thermal noise generated by the low-path resistive element RE1 (308), plus any residual noise generated by prior circuit elements, such as the low-path PDM DAC (304) and low-path gain modification device (306), post attenuation. Given that the total noise present at low-path gain modification device output (354) is given as −70 dBu, and given that the attenuation created by low-path resistive element RE1 (308) is −60 dB, the resultant noise as measured at the output of low-path resistive element (308) becomes slightly more than −130 dBu, which is the sum of the thermal noise of 100 ohms bulk resistance (−133 dBu) and the attenuated series noise from the input of RE1 (308), which is −130 dBu.

The high-path gain modification device (305) produces a gain of +20 dB, and the self-noise of the high-path gain modification device (305) at +20 dB gain is −86 dBu. High-path resistive element RE2 (307) provides a non-attenuated passive path which exhibits 100 ohms bulk series resistance (non-attenuated means, for example, that a +4 dBu signal at the input to RE2 (307) will remain approximately a +4 dBu signal at the output of RE2 (307) when measured under no effective load.) As the signal of the low-path output (336) rises and approaches a certain level, which according to the present embodiment is no lower than −66 dBu, the processor (302) sends a control signal via the control signal path (316) which causes high-path switching element (315) to close (i.e., to switch to the position opposite that depicted in FIG. 3A). According to the embodiment, this switch closure occurs immediately before the processor (302) sends high-path program signal to high-path PDM DAC (303), while allowing high-path switching element (315) enough time to becoming settled and bounce free (i.e., enough settling time so the high-path switching element (315) itself adds no significant distortion to the signal path.) To better anticipate the ideal timing of high-path switching element (315) closure, the signal delay feature in processor (302) (described elsewhere) will provide PCM processing (399) a suitable amount of time (e.g., on the order of microseconds or a few milliseconds) to determine in advance the optimal point or range of high-path switching element (315) closure timing, while processor (302) will activate via control signal path (316) such closure at a predetermined optimum point. In the event where high-path switching element (315) is closed and the signal on the high-path output (335) is active but falling in level so a high-path to low-path transitional event occurs, the processor (302) will similarly manage high-path switching element (315) so that as the just-transitioned signal falls to a certain threshold level (e.g., −66 dBu), or threshold level range, high-path switching element (315) will be opened by processor (302) via control signal path (316) resulting in the removal of high-path generated noise from the summed output (365) when an output signal at summed output (365) falls below the threshold level or threshold level range. The PCM processing block (399) of the processor (302) will manage high-path switching element (315) state in such a manner to assure that high-path generated noise is removed or reduced from summed output (365) whenever an output program signal at summed output (365) falls below or about a predetermined threshold level, which according to the embodiment is −66 dBu.

The high-path gain modification device (305) produces +20 dB of gain (which is apparent in FIG. 3C by the +20 dB increase in the height the signal on the high-path gain modification device output (353) relative to the signal level of the high-path DAC output (343)) and has −86 dBu of unweighted broadband self-noise). The high-path gain modification device (305) is followed by resistive element RE2 (307) with 100 ohms total series resistance and −133 dBu of unweighted broadband self-noise (the thermal noise of 100 ohms resistance). Since the self-noise of the resistive element RE2 (307) is so much less than the noise generated by the high-path gain modification device (305), the total broadband unweighted audio noise at the high-path output (335) of the high-path resistive element RE2 (307) is also roughly −86 dBu. Because the signal on the high-path gain modification device output (353) is switched by high-path switching element (315) into electrical connection with the summing node (360) when the program level of the low-path output (336) at the summing node (360) approaches or exceeds −66 dBu, there exists a roughly 20 dB level difference (the level difference between −86 dBu and −66 dBu) between program level on the low-path output (336) and high-path noise level when the high-path gain modification device (305) is switched into electrical connection with the summing node (360). This is also illustrated in FIG. 3C by vertical bars labeled "SUM ONLY LOW," and "SUM LOW+ HIGH." The 20 dB signal-to-noise difference provides a high degree of psychoacoustic masking to the −86 dBu broadband unweighted high-path noise level added by the closure of high-path switching element (315), making the noise generated by the high-path PDM DAC (303), high-path gain modification device (305), high-path resistive elements (307), high-path switching element (315) generally psychoacoustically undetectable under a normal range of program conditions. Because of the inherent difficulty, extracting objective baseline or systemic noise measurements from or during active audio program is generally not attempted. Broadband noise measurements are typically taken with no program present.

When high-path switching element (315) is open (which is the state in which the high-path switching element (315) is depicted in FIG. 3A), the total series resistance into the summing node (360) is 100 ohms, i.e., the inherent series resistance of low-path resistive element RE1 (308). When high-path switching element (315) is closed (i.e., the state opposite to that depicted in FIG. 3A), the parallel resistances of low-path resistive element RE1 (308) and high-path resistive element RE2 (307) produce a total source resistance at summing node (360) of 50 ohms, i.e., the total resistance of RE1 (308) and RE2 (307) when connected in parallel. According to the embodiment, when high-path switching element (315) is closed, the processor (302) adjusts the output level of either the low-path gain modification device (306), high-path gain modification device (305), or both low-path gain modification device (306) and high-path gain modification device (305), to compensate for any level-shift of the signal at the summed output (365) produced by the ratio of the change in the total source resistance against the fixed destination impedance of the external device (309) as described below. The processor (302) calculates the compensation required based on measurements it receives via ADCs (320), (325), (330). Lower absolute resistance values of the high-path resistive element (307) and the low-path resistive element (308) will typically provide for correspondingly lower level-shift values, i.e., when the high-path switching element is engaged and disengaged from the summing node. An amplifier level-shift, controlled by processor (302), can be accomplished by any method which provides digital control of an analog device. For one example, the gain of high-path gain modification device (305) and low-path gain modification device (306) could be adjusted (up or down), via control signal paths (337), (338), by a change in resistor value, such as a resistance value in an amplifier's feedback path. For example, the gain-setting resistor could be a digitally-controlled resistor. As an alternative example, amplifier gain-set resistance elements, controlled by processor (302) could be designed from discrete componentry, from known techniques, by one skilled in the art. In alternative embodiments where an element of the analog path is not directly level-adjusted (e.g., FIGS. 3A and 3B), the processor (302) and PCM processing block (399), besides signal conversion, management, and synthesis (as described elsewhere), can also mathematically calculate and create required level compensation shifts.

The high-path switching element (315) is to be understood to represent any method or technique under processor (302) control for removing or reducing the high-path output (335) from the summing node (360) in such a manner as to eliminate or reduce the self-noise generated by the high-path PDM DAC (303), high-path gain modification device (305), high-path resistive element (307). In a differential signal path, the high-path switching element (315) could be two discrete switching elements, with one switching element per each leg of the differential signal. According to an alternate embodiment, high-path gain modification device (305) may employ a selectable shutdown, mute or disable (etc.) function in which a design feature of the high-path gain modification device (305) itself allows selective (i.e., processor (302) controlled) removal of signal and noise from the high-path gain modification device output (353) of the high-path gain modification device (305). According to an additional alternative embodiment, shunt switching can be used, both in the primary and secondary stages when transformers or discrete resistances are used.

As in FIG. 3, the signal levels at the summing node (360), high-path gain modification device output (353), and low-path gain modification device output (354) are monitored by ADCs (320), (325), (330) when switched into monitoring via the switching elements (321), (326), (331), respectively. Each ADC (320), (325), (330) reports its analog input level to the processor (302). In passive summing of signals of the high-path output (335) and the low-path output (336) there will generally be amount of output level loss due to the relationships between the resistances of the high-path PDM DAC (303), high-path gain modification device (305), high-path resistive element (307), low-path PDM DAC (304), low-path gain modification device (306), low-path resistive element (308), and external device (309), both from the interplay of the summing build out resistances, and the source/destination resistance ratios. According to the embodiment, the ADC level reporting is used by the processor (302) to control the gain of high-path gain modification device (305) and low-path gain modification device (306), via control signal paths (337), (338), to compensate for normal passive level losses and other losses or changes in output level. The internal impedance of the ADCs (320), (325), (330) is great enough that switching the ADCs (320), (325), (330) into the circuit via switching elements (321), (326), (331) causes minimal amplitude shifts of the signal the ADCs (320), (325), (330) are measuring. The internal impedances of the ADCs (320), (325), (330) are preferably at least ten times greater, more preferably at least twenty times greater, and still more preferably at least forty times greater than the internal impedances of the high-path PDM DAC (303), high-path gain modification device (305), high-path resistive element (307), low-path PDM DAC (304), low-path gain modification device (306), low-path resistive element (308) in the signal paths the ADCs (320), (325), (330) are monitoring.

ADC (325) and ADC (330) are used to compare measured amplitudes with expected amplitudes. The processor (302) can send control signals via control signal paths (324), (328) to close switching elements (326), (331) connecting the ADCs (325), (330) to the high-path gain modification device output (353) and the low-path gain modification device output (354). The difference between the measured amplitude values provided by ADCs (325), (330) and the expected values are used by the processor (302) to gather and calculate correction/calibration factors. The measurements will typically be taken immediately at power-on with zero or null input program, but can also be taken during any sufficiently long period of zero or null input program, or, with proper filtering, during active program level. Switching elements (326), (331) are used to remove the ADC inputs from the low-level and high-level circuit paths when not in use, removing any potentially detrimental electrical issues.

While a two-path (i.e., "high-path" and "low-path") version of the multi-path PDM conversion system is described for clarity, other design approaches may use more than two paths. The novel multi-path PDM systems and methods are not limited to a two-path (i.e., low-path and high-path) topology, as shown in FIG. 1-3K, but can be realized with any number of paths of two or greater, as suggested by the four-path topology in circuits of FIG. 4 and FIG. 5. The multi-path A-D conversion system (400) of FIG. 4 shows a novel four-path PDM A-D conversion process and system using principles discussed. The multi-path A-D conversion system (400) performs a multi-path (multi-range) A-D conversion of an analog signal (420) of an analog signal source (401), which is split into four identical or near-identical signal paths-a low-path (418), a first middle path (417), a second middle path (416), and a high-path (415). The high-path (415), the second middle path (416), the first middle path (417), and the low-path (418) and are sent to gain modification devices (402), (403), (404), (405) respectively. The gain modification devices (402), (403), (404), (405) may be amplifiers, unity-gain amplifiers (buffers), or for the higher-level paths these may be attenuators. The gain modification devices (402), (403), (404), (405) may provide a signal level adjustment and sends its adjusted analog signals (422), (423), (424), (425) to a respective PDM ADC (406), (407), (408), (409). A PDM data streams (426), (427), (428), (429) feeds PDM data to a processor (410). While processor (410) is illustrated as a DSP, the processor (410) can be a DSP, microprocessor, FGPA, PLD, ASIC, or other processing devices capable of processing PDM digital-audio data in a novel manner as described elsewhere in this disclosure. This can include processing of PDM data streams (426), (427), (428), (429) into a format suitable for storage of PDM data into memory (411), (412), (413), (414) via PDM streams (431), (432), (433), (434), respectively, and synchronized in time by a common timing signal, clock (430). The novel multi-path PDM conversion system is not limited to 2 or 4 A-D paths, but can be realized with any two or more (n) of paths (i.e. 2, 3, 4, 5 . . . n).

The DSP processing of 4-path adaptive PDM data can employ identical functional elements as the 2-path embodiment, but employs four series and delay paths, four output switches, and four side-chain i/o processing paths. This four-path embodiment also applies to all alternate processing embodiments, including FIGS. 3E, 3F, 3G, 3H, 3I, 3J, and 3K. The multi-path PDM processing as taught in this disclosure can be applied to an adaptive PDM A-D and D-A conversion process employing many paths of two or more, as will be apparent to one skilled in the art after having reviewed the embodiments of this disclosure.

The multi-path D-A conversion system (500) of FIG. 5 shows a novel four-path PDM D-A conversion system and method using principles described in this disclosure. The multi-path D-A conversion system (500) performs a multi-path (multi-range) D-A conversion of previously-adapted PDM signals in four paths-a low-path (509), a low-middle path (508), a high-middle path (507), and a high-path (506). The PDM data stream of the low-path (509), a low-middle path (508), a high-middle path (507), and a high-path (506)

is shown being feed from memory (504), (503), (502), (501) respectively and feed the processor (510) under synchronous timing from clock (505). The processor (510) performs the functions such as PCM-to-PDM conversion, PDM-to-PCM conversion, signal delay, gating, transition synthesis, digitally-controlled analog level adjustment (etc.) as described in the two-path embodiments of FIGS. 3-3K. The processor feeds PDM DACs (550), (551), (552), (553) via PDM data streams (521), (529), (532), (536), respectively. The PDM data stream (521), (529), (532), (536) feed the gain modification device (555), (556), (557), (558), via PDM DAC outputs (565), (566), (567), (568), respectively. The gain modification devices (555), (556), (557), (558) feed resistive summing elements RE4 (589), RE3 (590), RE2 (591), RE1 (592) via analog signal paths (584), (585), (586), (587), respectively, with high-path analog noise managed by switching elements (581), (582) under control of the processor (510) via control signal paths (527), (528), respectively. Resistive summing elements (589), (590), (591), (592) feed a summing node (598) via analog signal paths (542), (593), (594), (595), respectively. The resistive elements and summing node (598) can, in whole or part, comprise transformers and related transformer summing techniques, as understood to one skilled in the art. The result is a dynamically-contiguous analog signal, the analog output signal (597), which feeds an external device (599). The output signal being can be single-ended, differential or other analog signal form.

To provide signal level calibration, various analog output signal levels can be fed back to the processor (510) and the processor (510) can adjust the gain or attenuation of the gain modification device (555), (556), (557), (558). Analog signal paths (584), (585), (586), (587) and the analog output signal (597) can selectively feed the ADCs (560), (561), (562), (563), (564), respectively, via relay or switching elements (573), (574), (575), (576), (583). The switching elements (573), (574), (575), (576), (583) are controlled by the processor (510) through control signal paths (522), (530), (533), (537), (526), respectively, and selectively engage side-chain signal paths (577), (578), (579), (580), (597a) to the ADC input paths (569), (570), (571), (572), (540). The ADCs (560), (561), (562), (563), (564), which feed the processor (510) via ADC outputs (523), (531), (534), (538), (525), respectively, for system calibration, described elsewhere herein. Control signal paths (520), (524), (535), (539) are shown for alternative embodiments where the processor (510) can control digitally-controllable analog elements of the output paths.

A multi-path PDM conversion apparatus, system, and method, has been described in multiple embodiments. While the above description contains many specificities, these should not be construed as limitations of novel PDM conversion system and method, but rather as exemplifications of embodiments thereof. Many other variations are within the scope of the novel PDM conversion system. For instance: The novel multi-path PDM conversion system and method is not limited to an input signal of any particular range value (e.g., −130 dBu to +30 dBu)—with suitable design criteria based entirely on the novel multi-path PDM conversion system, an input signal of any value may be used; the switching in and out of mid- and/or high-path output circuitry may be rapid or involve fade-ins and fade-outs, or dithering; the digital signal processor may be any manner of digital processor or processors or environments (such as FPGA, a mix of DSP, FPGA, memory and discrete logic, etc.) exhibiting adequate bit-handling capability (1-bit PDM and multi-bit PCM), speed, bandwidth, input/output capabilities, and programmable features to perform the necessary processing; although 100 ohm resistive elements are taught, the novel multi-path PDM conversion system can be designed with any resistances appropriate and suitable to low noise and high-performance passive summing; the resistive elements may generate values of attenuation (or no attenuation) other than the particular values taught—the novel multi-path PDM conversion system can function successfully over a wide range of attenuation values when suitably designed in consort with other parameters of the circuitry; the high-path gain modification devices(s) may be configured for any gain value (or zero gain) other than the particular values taught—the novel multi-path PDM conversion system can function successfully over a wide range of high-path(s) gain values when suitably designed in consort with other parameters of the circuitry; DSP "switch" or "gate," such as switching elements (397), (398) can represent any method of on-off control of PDM signals; a PDM DAC, such as high-path PDM DAC (303) and low-path PDM DAC (304) can represent any method and/or topology of PDM D-A conversion within the parameters of the novel multi-path PDM conversion system; the high-path (or higher paths) series switching element(s) can be any means for removing or reducing the high-path(s) output signal(s) from electrical connection with the summing node in such a manner as to eliminate or reduce the self-noise generated by the high-path(s) components—possible means could include, but are not limited to, selectively shutting down the path amplifier via power supply, internal shutdown or disable or mute pin, or other methods, grounding or shunting the high-path(s) through suitable grounding path resistance(s) or other suitable loads, using a low noise complementary metal oxide semiconductor (CMOS) or field effect transistor (FET) or related active switching device (although FET and CMOS devices may have self-noise inherently higher than what is taught above), shunt switching, including switching of primaries and/or secondaries of transformer resistive elements; although specific examples of path switching threshold levels are described herein, the novel multi-path PDM conversion system is not limited to these specific switching levels and may employ other switching threshold levels and/or other switch timing dynamics (e.g., a switch may be held closed for some period of time even though the output signal level may drop below the threshold point where the switch was described above as changing state from opened to closed); although specific examples of path transition crossfade levels and timings are described herein, the novel multi-path PDM conversion system is not limited to these specific levels and timings and may employ other transitional levels and/or other transitional timing dynamics; although specific ADC calibration procedures are described herein, the novel multi-path PDM conversion system is not limited to such calibration criteria, and may follow other calibration procedures which may be optimized for design variations; digitally-controlled (i.e., DSP-controlled) resistances may be used in any functional element described in the novel multi-path PDM conversion system, as required to meet level, crossfade, compensation, and other stated goals; high-path(s) resistive elements can be implemented up-stream from the switching elements to improve noise and/or switching performance (e.g., a shunt-switched secondary of a transformer); although some of the gain modification devices have been described as analog amplifiers with particular characteristics (e.g., a maximum output of +30 dBu and a unity-gain noise floor of −106 dBu), the novel multi-path PDM conversion system is not limited to amplifiers with these characteristics and may employ any low noise, single-ended or differential, audio-grade amplifiers; although DACs with particular characteristics are described herein (e.g., −112 dBu noise level, +10 dBu maximum output level of 122 dB usable dynamic range, etc.), the novel multi-path PDM conversion system is not limited to DACs with these characteristics and may employ any architecture or topology of DAC appropriate to the objectives of the novel multi-path PDM conversion system; although ADCs with particular characteristics are described herein, the novel multi-path PDM conversion system is not limited to ADCs with these characteristics and may employ any topology or architecture of ADC appropriate to the objectives of the novel multi-path PDM conversion system; although unipolar or unsigned conversion topology may be implied herein for explanatory clarity, the novel multi-path PDM conversion system is not limited to unipolar or unsigned style conversion and may employ any topology or bit management protocol of PDM conversion; while level-shift and/or level mapping examples are shown and described with specific level shifts and values for clarity of explanation, the novel multi-path PDM conversion system may utilize level shifting and level mapping of any value that helps to achieve low noise and high dynamic range conversion of analog signals); multiple calibration feedback A-D converters are shown in FIG. 3 for clarity of explanation-one or more ADCs may be switched between paths utilizing associated relays so that, for instance, a single ADC may be utilized in multiple paths; while the embodiments are described in discrete functional elements (e.g., DSP, DAC, ADC, gain modification devices, resistive element, etc.), functional elements may be integrated into a common device—for instance, an amplifier function may be integrated into a DAC device so the DAC device, including integrated circuit devices, may possess an output with sufficiently low output impedance, sufficiently high output current, sufficiently high output gain capability, sufficient frequency filtering characteristic, sufficient access to gain adjustment, etc., (i.e., the integrated DAC device performs functions which might otherwise be in the domain of an external amplifier device)—for instance, a DAC device may be integrated into a DSP device, or a resistive element possessing proper output resistance and/or attenuation characteristics, etc., may be integrated into the integrated DAC and DSP device, etc.; multi-path DSP processing of PDM data, after the PDM has been converted for PCM processing by DSP, can include any DSP processing functions, such as overall signal level adjustment and control, equalization, dynamics control (e.g., compression, limiting, expansion, spectral dynamics, etc.), coded mid-side processes, gating, reverberation, mixing or summing, VR/AR/MR-related localization processing, etc., as would be apparent to one skilled in the art after gaining a thorough understanding of the fundamental novelties herein; while specific values of input and output amplifier gains or attenuations and output resistive network gains or attenuations and/or bulk series resistances are given, the novel multi-path PDM conversion system is not limited to these specific values and can employ a wide range of the values toward achieving the objectives of the novel multi-path PDM conversion system (i.e., A-D and D-A conversion of PDM signals that maintains low noise and high dynamic range); real-world electrical noise performance is affected by myriad, complex, variable and often unpredictable external parameters and noise sources. The noise analyses in the description of the novel multi-path PDM conversion system are reasonable generalizations of objective performance, rather than exacting noise specifications subject to the variables and design variabilities generally beyond descriptive analysis required for an understanding of the novel multi-path PDM conversion system; certain diagrammatical notations are shown for clarity of explanation, such as simple square waves representing a PDM signal, etc., but such notations may not represent the actual waveform described. The timing elements in FIG. 3J and elsewhere (e.g., 40 ms, Tt, Td, etc.) are given as examples not limitations; myriad timing values could be used within the scope of the novel multi-path PDM conversion system; some functions provided by DSP switching (e.g., switching elements (397), (398) of FIG. 3A) could also be provided elsewhere, such as, but not limited to, by DSP-controlled memory flow (e.g. memory locations (340), (341)), or signal conditioning via delay function (as shown by control signal (370) of FIG. 3F); while D-A conversion examples in the novel multi-path PDM conversion system show a summing node combining all outputs into a single, dynamically-contiguous output, each analog output (for example high-path output (335) and low-path output (336)) could also be left as non-summed discrete signals for a multi-bit input of an adaptive downstream destination; while D-A conversion examples in the novel multi-path PDM conversion system show each DSP output feeding discrete (i.e., separate) DAC devices (for example high-path PDM stream (333) and low-path PDM stream (334)), each processor output could also be left as discrete signals for a multi-bit input of an adaptive downstream destination; while A-D conversion examples in the novel multi-path PDM conversion system show each A-D output feeding discrete (i.e., separate) memory locations (for example high-path PDM stream (132) and low-path PDM stream (133)), each A-D output (for example high-path PDM ADC output path (122) and low-path PDM ADC output path (123)) or memory locations (145), (146) could also be discrete signals for feeding a multi-bit input of an adaptive downstream destination. While the memory locations (145), (146) are shown as discrete for clarity of adaptive path separation, such discrete memory path locations could be placed on a single memory device.

The processor (302) in FIGS. 3A-3I, and 3K all show the ADC outputs (323), (327), (329) into the processor (302) and control signal paths (316), (322), (324), (328), (337), (338) from the processor (302). These can interact with processor (302) and the circuits represented in the block diagrams of FIGS. 3 and 3E as described.

Throughout this disclosure, a PDM ADC refers to an ADC capable of producing a PDM stream from an analog signal. Throughout this disclosure, a PDM DAC refers to a DAC capable of producing an analog signal from a PDM stream. Some ADCs capable of producing a PDM stream from an analog signal may be capable of other functions, for example, analog to PCM conversion. These ADCs fall within the meaning of PDM ADC. Likewise, some DACs capable of producing an analog signal from a PDM stream may be capable of performing other functions, for example, PCM to analog conversion. These DACs fall within the meaning of PDM DAC.

It is the intent of the inventor that the embodiments and variations described in this Description, all fall within the scope of the claimed invention. While the examples, exemplary embodiments, and variations are helpful to those skilled in the art in understanding the claimed invention, it should be understood that, the scope of the claimed invention is defined solely by the following claims and their equivalents.

What is claimed is:

1. An apparatus for processing pulse-density modulation (PDM) signals, comprising:
memory including instructions stored thereon;
a processor, that in response to execution of the instructions causes the apparatus to:
synchronously receive a first PDM stream and a second PDM stream, the first PDM stream representing a first signal level range and the second PDM stream representing a second signal level range of a composite signal;
create a first synthesized pulse-code modulation (PCM) stream of the first PDM stream and a second synthesized PCM stream of the second PDM stream; and
create a transition event between the first PDM stream and the second PDM stream based on a predetermined signal level.

2. The apparatus of claim 1, further comprising:
data storage memory; and
the first PDM stream and the second PDM stream synchronously retrieved from parallel locations of the data storage memory.

3. The apparatus of claim 1, wherein:
the first PDM stream and the second PDM stream synchronously retrieved from a parallel data stream.

4. The apparatus of claim 1, wherein:
the first PDM stream and the second PDM stream are delayed prior to the transition event.

5. The apparatus of claim 1, wherein:
creating the transition event further includes:
selectively feeding a first output with the first PDM stream before and after the transition event, but not during the transition event; and
selectively feeding a second output with the second PDM stream before and after the transition event, but not during the transition event.

6. The apparatus of claim 5, wherein:
the first PDM stream and the second PDM stream are delayed prior to the transition event.

7. The apparatus of claim 1, further comprising:
a first gain modification device receiving a first analog representation of the first PDM stream;
a second gain modification device receiving a second analog representation of the second PDM stream; and
creating the transition event further includes:
selectively controlling a first gain value of the first gain modification device and a second gain value of the second gain modification device.

8. The apparatus of claim 7, wherein:
the first PDM stream and the second PDM stream are delayed prior to the transition event.

9. The apparatus of claim 1, wherein:
creating the transition event further includes:
generating a first synthesized PDM transition stream from the first synthesized PCM stream and a second synthesized PDM transition stream from the second synthesized PCM stream.

10. The apparatus of claim 9, wherein:
creating the transition event further includes:
selectively feeding a first output with the first PDM stream before and after the transition event and with the first synthesized PDM transition stream during the transition event; and
selectively feeding a second output with the second PDM stream before and after the transition event and with the second synthesized PDM transition stream during the transition event.

11. The apparatus of claim 10, wherein:
the first PDM stream and the second PDM stream are delayed prior to the transition event.

12. The apparatus of claim 1, further comprising:
a first PDM digital-to-analog converter (DAC) receiving the first PDM stream;
a second PDM DAC receiving the second PDM stream;
a first gain modification device and a second gain modification device; and
the first gain modification device level-modifies a first DAC output, the second gain modification device level-modifies a second DAC output.

13. The apparatus of claim 12, further comprising:
a summer; and
the summer sums a first gain modification device output and a second gain modification device output all in a proportion that recreates a signal level relationship of the composite signal.

14. The apparatus of claim 12, further comprising:
selectively controlling a first gain value of the first gain modification device and a second gain value of the second gain modification device.

15. The apparatus of claim 12, wherein:
creating the transition event further includes:
selectively feeding a first output with the first PDM stream before and after the transition event, but not during the transition event; and
selectively feeding a second output with the second PDM stream before and after the transition event, but not during the transition event.

16. The apparatus of claim 15, wherein:
the first PDM stream and the second PDM stream are delayed prior to the transition event.

17. The apparatus of claim 12, wherein:
creating the transition event further includes:
generating a first synthesized PDM transition stream from the first synthesized PCM stream and a second synthesized PDM transition stream from the second synthesized PCM stream;
selectively feeding a first output with the first PDM stream before and after the transition event and with the first synthesized PDM transition stream during the transition event; and
selectively feeding a second output with the second PDM stream before and after the transition event and with the second synthesized PDM transition stream during the transition event.

18. The apparatus of claim 17, wherein:
the first PDM stream and the second PDM stream are delayed prior to the transition event.

19. An apparatus for processing pulse-density modulation (PDM) signals, comprising:
an input analog signal path receiving a dynamically-contiguous analog signal;
a first gain modification device outputting and noise-optimized for a first signal level range of the dynamically-contiguous analog signal;
a second gain modification device outputting and noise-optimized for a second signal level range of the dynamically-contiguous analog signal different than the first signal level range, the first gain modification device and the second gain modification device receive the input analog signal path;
a first PDM analog-to-digital converter (ADC) outputting a first PDM stream representing the first signal level range;

a second PDM ADC outputting a second PDM stream representing the second signal level range; and the first PDM stream and the second PDM stream represent separate partial dynamic range portions of the dynamically-contiguous analog signal.

20. The apparatus of claim 19, further comprising:

a memory; and the first PDM stream and the second PDM stream stored synchronously in parallel locations of the memory in a manner to allow later reconstruction of the dynamically-contiguous analog signal.

21. The apparatus of claim 19, wherein:

the first PDM stream and the second PDM stream synchronously retrieved from parallel data streams in a manner to allow later reconstruction of the dynamically-contiguous analog signal.

22. The apparatus of claim 19, further comprising:

memory including instructions stored thereon;

a processor, that in response to execution of the instructions causes the apparatus to:

receive the first PDM stream and the second PDM stream;

create a first synthesized pulse-code modulation (PCM) stream of the first PDM stream and a second synthesized PCM stream of the second PDM stream; and create a transition event between the first PDM stream and the second PDM stream based on a predetermined signal level.

23. The apparatus of claim 22, further comprising:

the first PDM stream and the second PDM stream are delayed prior to the transition event;

creating the transition event further includes:

generating a first synthesized PDM transition stream from the first synthesized PCM stream and a second synthesized PDM transition stream from the second synthesized PCM stream;

selectively feeding a first output with the first PDM stream before and after the transition event and with the first synthesized PDM transition stream during the transition event; and selectively feeding a second output with the second PDM stream before and after the transition event and with the second synthesized PDM transition stream during the transition event.

24. The apparatus of claim 19, further comprising:

a first PDM digital-to-analog converter (DAC) including a first DAC output representing the first PDM stream;

a second PDM DAC including a second DAC output representing the second PDM stream; and the first gain modification device level-modifies the first DAC output and the second gain modification device level-modifies the second DAC output.

25. The apparatus of claim 24, further comprising:

a summer; and the summer sums a first gain modification device output and a second gain modification device output all in a proportion that recreates a signal level relationship of the dynamically-contiguous analog signal.

26. The apparatus of claim 24, further comprising:

memory including instructions stored thereon;

a processor, that in response to execution of the instructions causes the apparatus to:

create a first synthesized pulse-code modulation (PCM) stream of the first PDM stream and a second synthesized PCM stream of the second PDM stream; and create a transition event between the first PDM stream and the second PDM stream based on a predetermined signal level.

27. The apparatus of claim 26, further comprising:

creating the transition event further includes:

generating a first synthesized PDM transition stream from the first synthesized PCM stream and a second synthesized PDM transition stream from the second synthesized PCM stream;

selectively feeding a first output with the first PDM stream before and after the transition event and with the first synthesized PDM transition stream during the transition event; and selectively feeding a second output with the second PDM stream before and after the transition event and with the second synthesized PDM transition stream during the transition event.

28. The apparatus of claim 26, further comprising:

the first PDM stream and the second PDM stream are delayed prior to the transition event; and creating the transition event further includes selectively controlling a first gain value of the first gain modification device and a second gain value of the second gain modification device.

* * * * *